(12) United States Patent  (10) Patent No.: US 9,123,538 B2
Wheeler et al.  (45) Date of Patent: Sep. 1, 2015

(54) SILICON NANOCRYSTAL INKS, FILMS, AND METHODS

(71) Applicant: REGENTS OF THE UNIVERSITY OF MINNESOTA, Minneapolis, MN (US)

(72) Inventors: Lance Michael Wheeler, Minneapolis, MN (US); Uwe Richard Kortshagen, Roseville, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 93 days.

(21) Appl. No.: 13/870,554

(22) Filed: Apr. 25, 2013

(65) Prior Publication Data

US 2013/0285007 A1    Oct. 31, 2013

Related U.S. Application Data

(60) Provisional application No. 61/638,814, filed on Apr. 26, 2012.

(51) Int. Cl.
*H01L 21/02* (2006.01)
*C09D 11/00* (2014.01)
*H01L 29/02* (2006.01)

(52) U.S. Cl.
CPC .......... *H01L 21/02612* (2013.01); *C09D 11/00* (2013.01); *H01L 29/02* (2013.01)

(58) Field of Classification Search
CPC ... H01L 21/02612; H01L 29/02; C09D 11/00

USPC .......... 257/9, 103, E21.04, E21.09, E31.032, 257/E31.043; 117/84; 252/500; 423/325; 428/402, 403; 438/72, 478, 689; 556/478
See application file for complete search history.

(56) References Cited

U.S. PATENT DOCUMENTS

| | | | |
|---|---|---|---|
| 5,262,357 A | 11/1993 | Alivisatos et al. | |
| 5,576,248 A | 11/1996 | Goldstein | |
| 7,446,335 B2 | 11/2008 | Kortshagen et al. | |
| 8,016,944 B2 | 9/2011 | Kortshagen et al. | |
| 2005/0000409 A1* | 1/2005 | Kauzlarich et al. | 117/89 |
| 2005/0070106 A1* | 3/2005 | Kauzlarich et al. | 438/689 |
| 2007/0012355 A1 | 1/2007 | LoCascio et al. | |
| 2008/0220175 A1 | 9/2008 | Mangolini et al. | |
| 2008/0268462 A1* | 10/2008 | Kosmeder et al. | 435/7.1 |
| 2009/0053878 A1 | 2/2009 | Kelman et al. | |
| 2009/0217973 A1 | 9/2009 | Alivisatos et al. | |

OTHER PUBLICATIONS

Aberle, "Surface passivation of crystalline silicon solar cells: a review," *Progress in Photovoltaics: Research and Applications*, Sep./Oct. 2000; 8(5):473-487. Available online Nov. 2, 2000.

(Continued)

*Primary Examiner* — Dao H Nguyen
(74) *Attorney, Agent, or Firm* — Mueting, Raasch & Gebhardt, P.A.

(57) ABSTRACT

Silicon nanocrystal inks and films, and methods of making and using silicon nanocrystal inks and films, are disclosed herein. In certain embodiments the nanocrystal inks and films include halide-terminated (e.g., chloride-terminated) and/or halide and hydrogen-terminated nanocrystals of silicon or alloys thereof. Silicon nanocrystal inks and films can be used, for example, to prepare semiconductor devices.

29 Claims, 25 Drawing Sheets

(56) References Cited

OTHER PUBLICATIONS

Anthony et al., "Routes to Acieving High Quantum Yield Luminescence from Gas-Phase-Produced Silicon Nanocrystals," *Advanced Functional Materials*, Nov. 8, 2011; 21(21):4042-4046. Available online Aug. 22, 2011.
Bergerson et al., "Assembly of Organic Molecules on Silicon Surfaces via the Si-N Linkage," *J. Am. Chem. Soc.*, 1999; 121(2):454-455.
Burr et al., "Carrier transport in thin films of silicon nanoparticles," *Phys. Rev. B*. Aug. 15, 1997; 56(8):4818-4824.
Ciampi et al., "ChemInform Abstract: Wet Chemical Routes to the Assembly of Organic Monolayers on Silicon Surfaces via the formation of Si-C Bonds: Surface Preparation, Passivation and Functionalization," *ChemInform*, Oct. 19, 2010; 41(42): DOI: 10.1002/chin.201042248. Available online Sep. 23, 2010.
Deng et al., "Raman spectral studies of ion association and solvation in solutions of LiAsF-acetone," *Journal of the Chemical Society, Faraday Transactions*, 1992; 88(19):2891-2896.
Erogbogbo et al., "Creating Ligand-Free Silicon Germanium Alloy Nanocrystal Inks," *ACS Nano*, 2011; 5(10):7950-7959.
Fawcett et al., "Solvent-induced frequency shifts in the infrared spectrum of acetonitrile in organic solvents," *The Journal of Physical Chemistry*, Sep. 1993; 97:9293-9298.
Forsman et al., "The Origins of Hydration Forces: Monte Carlo Simulations and Density Functional Theory," *Langmuir*, 1997; 13(20):5459-5464. Available online Oct. 1, 1997.
Garrone et al., "A Nanostructured Porous Silicon Near Insulator Becomes Either a p- or an n-Type Semiconductor upon Gas Adsorption," *Advanced Materials*, 2005; 17:528-531. Available online Mar. 3, 2005.
Gresback et al., "Nonthermal plasma synthesis of size-controlled, monodisperse, freestanding germanium nanocrystals," *Appl. Phys. Lett.* 2007; 91(9):093119.
Hazra et al., "Nanocrystalline silicon as intrinsic layer in thin film solar cells," *Solid State Communications*, Dec. 1998; 109(2):125-128.
Hiemenz, *Principles of Colloid and Surface Chemistry Third Ed, Revised and Expanded*, Taylor & Francis, New York, NY, 1997.
Holman et al., "Nanocrystal Inks without Ligands: Stable Colloids of Bare Germanium Nanocrystals," *Nano Letters*, Article and Supporting Information, Apr. 21, 2011; 11:2133-2136.
Holman, "Interfaces: the key to nanomaterials and high efficiency solar cells," *Abstract and Presentation for 1st Nano Workshop in Belfast*, Feb. 21, 2011.
Holman, "Field-effect transistors from colloidal silicon and germanium nanocrystals," *Abstract and Talk for Fall MRS*, Nov. 28-Dec. 2, 2010, Session F10.2, website www.mrs.org/f10program-f.
Holman, "Germanium Nanocrystal Solar Cells," *Dissertation*, University of Minnesota, Minneapolis, MN; submitted Sep. 2010.
Holman, "Germanium and Silicon Nanocrystals for Solar Cells," *Talk at Tohoku University, Sendai, Japan*, Aug. 6, 2010.
Holman, "Germanium and Silicon Nanocrystals for Solar Cells," *Talk to Oda Group at TiTech, Tokyo, Japan*, Jul. 22, 2010.
Holman, "Germanium Nanocrystal Thin-Films for Photovoltaic Applications," *Talk to Okazaki Group at TiTech, Tokyo, Japan*, Jul. 20, 2010.
Holman, "Germanium Nanocrystal Thin Films for Photovoltaic Applications," *Talk at AIST, Tsukuba, Japan*, Jul. 16, 2010.
Holman et al., "Germanium and Silicon Nanocrystal Thin-Film Field-Effect Transistors from Solution," *Nano Letters*, Jun. 9, 2010; 10:2661-2666.
Holman, "Germanium Nanocrystal Solar Cells," *Abstract and Talk for Spring MRS*, Apr. 6-Apr. 8, 2010, Session T4.5, website www.mrs.org/s10program-t.
Holman, "Germanium Nanocrystal Thin-Films for Photovoltaic Applications," *Abstract and Talk for PV-Lab in Neuchatel, Switzerland*, Mar. 15, 2010.
Holman et al., "A flexible method for depositing dense nanocrystal thin films: impaction of germanium nanocrystals," *Nanotechnology*, Aug. 20, 2010; 21(33):335302. Available online Jul. 27, 2010.
Holman, "Germanium Nanocrystals Thin-Films for Photovoltaic Applications Nanocrystals," *Abstract and Poster for Fall MRS*, Nov. 30-Dec. 4, 2009, Session N10.23. website www.mrs.org/f09-abstract-n.
Holman, "Germanium Nanocrystal Thin Films for Electronic Applications," Abstract of Nov. 2009; Retrieved from the Internet on Apr. 11, 2014; http://www.me.umn.edu/labs/ukgroup/abstracts/Holman.pdf.
Holman, "Thin Films of Plasma-Synthesized Germanium Nanocrystals for Electronic Applications," *Talk at 2009 ISPC*, Jul. 31, 2009.
Holman et al., "Solution-Processed Germanium Nanocyrstal Thin Films as Materials for Low-Cost Optical and Electronic Devices," *Langmuir*, 2009; 25(19):11883-11889. Published online Jul. 30, 2009.
Holman, "Silicon and Germanium Nanocrystal Electronic Devices," *Abstract and Talk for Nanomanufacturing Summit*, May 27, 2009.
Holman, "Germanium Nanocrystals Thin Films for Electronic Applications," *Talk at Spring MRS*, Apr. 13-Apr. 17, 2009, Session A11.5, www.mrs.org/s09-program-a.
Israelachvili, *Intermolecular and Surface Forces*, Academic Press Inc., Waltham, MA; 2011.
Jeng et al., "Infrared matrix isolation studies of molecular interactions: complexes of trichlorsilane, HSiCl3, with selected bases," *Inorganic Chemistry*, 1990; 29(4):837-842.
Jurbergs et al., "Silicon nanocrystals with ensemble quantum yields exceeding 60%," *Appl. Phys. Lett.*, 2006; 88(23):233116.
Kortshagen et al., "Nonthermal plasma synthesis of semiconductor nanocrystals," Journal of Physics D: Appl. Phys., Jun. 2009; 42(11):113001.
Kovalenko et al., "Colloidal Nanocrystals with molecular metal chalcogenide surface ligands," *Science*, Jun. 12, 2009; 324(5933):1417-1420.
Law et al., "Structural, optical, and electrical properties of PbSe nanocrystal solids treated thermally or with simple amines," *J. Am. Chem. Soc.*, May 7, 2008; 130(18):5974-5985. Available online Apr. 9, 2008.
Liang et al., "Interaction forces between colloidal particles in liquid: theory and experiment," *Advances in Colloid and Interface Science*, Oct. 31, 2007; 134:151-166. Available online Apr. 21, 2007.
Liptak et al., "Surface chemistry dependence of antive oxidation formation on silicon nanocrystals," *J. Appl. Phys.*, 2009; 106:064313.
Liu et al., "Robust, functional nanocrystal solids by infilling with atomic layer deposition," *Nano Letters*, Dec. 14, 2011; 11(12):5349-5355. Available online Oct. 28, 2011.
Liu et al., "Hybrid cells from P3HT and silicon nanocrystals," *Nano Letters*, Jan. 9, 2009; 9(1):449-452.
Mangolini et al., "Plasma-Assisted Syntheses of Silicon Nanocrystal Links," *Adv. Mater.*, 2007; 19(18):2513-2519. Available online Aug. 22, 2007.
Mangolini et al., "High-yield plasma syntheses of luminescent silicon nanocrystals," *Nano. Letters.*, Apr. 2005; 5(4):655-659.
Martinez et al., "Electronic Structure of Silicon Nanocrystals Passivated with Nitrogen and Chlorine," *Journal of Physical Chemistry*, 2010; 114:12427-12431.
Matsubara et al., "C NMR estimation of preferential solvation of lithium ions in nonaqueous mixed solvenets," *Journal of the Chemical Society, Faraday Transactions*, 1998; 94:3601-3605.
Murray et al., "Self-organization of CdSe Nanocrystallites into Three-Dimensional Quantum Dot Superlattices," *Science*, Nov. 24, 1995; 270(5240):1335-1338.
Nag et al., "Metal-free inorganic ligands for colloidal nanocrystals: $S^{2-}$, $HS^-$, $Se^{2-}$, $HSe^-$, $Te^{2-}$, $HTe^-$, $TeS_3^{2-}$, $OH^-$, and $NH_2^-$ as surface ligands," *Journal Am Chem Soc.*, Jul. 13, 2011; 133(27):10612-10620. Available online Jun. 17, 2011.
Nyquist, "Infrared Studies of Keytones: Parameters Affecting the Induced Carbonyl Stretching vibration by Solute/Solvent Interaction," *Applied Spectroscopy*, 1990; 44(3):433-438.

(56) References Cited

OTHER PUBLICATIONS

Owen et al., "Reaction Chemistry and ligand exchange at cadmium-selenide nanocrystal surfaces," *J. Am. Chem. Soc.*, Sep. 17, 2008; 130(37):12279-12281. Available online Aug. 23, 2008.

Pons et al., "Hydrodynamic dimensions, electrophoretic mobility, and stability of hydrophilic quantum dots," *Journal of Physical Chemistry B*, Oct. 19, 2006; 110(41):20308-20316.

Rivillon et al., "Gas Phase Chlorination of Hydrogen-Passivated Silicon Surfaces," *Appl. Phys. Lett.*, 2004; 85(13):2583.

Salivati et al., "Chemistry of Silicon Nanocrystal Surfaces Exposed to Ammonia," *Journal of Physical Chemistry*, 2010; 114:16924-16928. Available online Mar. 10, 2010.

Salivati et al., "Effect of surface chemistry on quantum confinement and photoluminescence of ammonia-passivated silicon nanocrystals," *Journal of Physical Chemistry Letters*, 2010; 1(13):1957-1961. Available online Jun. 11, 2010.

Shih et al. "Understanding the Stabilization of Liquid-Phase-Exfoliated Graphene in Polar Solvents: Molecular Dynamics Simulations and Kinetic Theory of Colloid Aggregation," *J. Am. Chem. Soc.*, 2010; 132(41):14638-14648. Available online Sep. 29, 2010.

Timoshenko et al., "Free charge carriers in mesoporous silicon," *Physical Review B*, 2001; 64:085314.

Uchida et al., "Surface nitridation of silicon nano-particles using double multi-hollow discharge plasma CVD,"*Physica Status solidi C.*, Oct. 2011; 8(10):3017-3020. Available online Jul. 19, 2011.

Vetterl et al., "Intrinsic microcrystalline silicon: A new material for photovoltaics," *Solar Energy Materials and Solar Cells*, Apr. 15, 2000; 62(1-2):97-108.

Wheeler et al., "Hypervalent surface interactions for colloidal stability and doping of silicon nanocrystals," *Nature Communications 4*, Article No. 2197, Jul. 29, 2013.

Wheeler et al., "Nonthermal Plasma Synthesis of Silicon Nanocrystals from SiCl4 for Solution-Processed Thin Film Technology," *Abstract AIChE*, Oct. 16, 2011.

Wheeler et al., "Electrostatic Stabilization of Group IV Nanocrystals for Solution-Processed Photovoltaics," *AIChE Talk*, Oct. 17, 2011.

Wheeler et al., "Nonthermal Plasma Synthesis of Silicon Nanocrystals from SiCl4 for Solution-Processed Thin Film Technology," *ISPC Conference Talk, ISPC Conference Proceedings*, Jul. 24-26, 2011.

Wheeler et al., "Electrostatic Stabilization of Silicon Nanocrystal Colloids for Solution-Processed Photovoltaics," *IPRIME Annual Meeting*, Abstract and Poster, Minneapolis, MN; May 31-Jun. 2, 2011.

Wheeler et al., "Electrostatic Stabilization of Silicon Nanocrystal Colloids for Solution-Processed Photovoltaics," *IPRIME Abstract and Poster*, Mar. 5, 2011.

Yu et al., "The electronic conduction mechanism of hydrogenated nanocrystalline silicon films," *IEEEXplore*, Date of conference Oct. 24-Oct. 28, 1995 in Beijing:66-68. Website http://ieeexplore.ieee.org.

Zaitseva et al., "Effect of Nitrogen on the stability of silicon nanocrystals produced by decomposition of Alkyl Silanes," *Journal of Physical Chemistry*, 2008; 112(10):3585-3590.

\* cited by examiner

US 9,123,538 B2

SILICON NANOCRYSTAL INKS, FILMS, AND METHODS

This application claims the benefit of U.S. Provisional Application No. 61/638,814, filed Apr. 26, 2012, which is hereby incorporated by reference in its entirety.

GOVERNMENT FUNDING

This invention was made with government support under CBET-0756326 awarded by the National Science Foundation and DE-AC52-06NA25396 awarded by the Department of Energy. The government has certain rights in the invention.

BACKGROUND

The size-dependent optoelectrical properties of semiconductor nanocrystals (NCs) hold great promise for device applications such as photovoltaics, light-emitting diodes, and photodetectors. Additionally, the prospect of films cast from colloidal solutions of these semiconductor nanocrystals offers a cost-efficient and scalable deposition technique with the potential for widespread application.

Group II-VI and IV-VI compound semiconductors have dominated the field of nanocrystal thin films owing to well-established solution-phase synthesis processes. The process results in a sterically stabilized colloidal dispersion from which ligand-capped nanocrystals will naturally self-assemble when cast into a film. Post-processing to remove or exchange the electrically-insulating ligands is typically done in order to form a more dense, electronically-coupled nanocrystal film.

The scarcity and toxicity of many Group II-VI and IV-VI semiconductor materials make silicon a more attractive material. However, solution synthesis of silicon nanocrystals has proven difficult due to the high temperatures needed. Nonthermal plasma synthesis of Si and Ge nanocrystals as an effective alternative to typical solution techniques has been previously demonstrated.

Nonthermal plasma synthesis will uniquely produce free-standing, or bare, nanocrystals. The well-developed method of decomposing silane as the silicon source results in an H-terminated nanocrystal surface. Unfortunately, efforts to disperse H-terminated Si nanocrystals in solvents have been unsuccessful. Stable suspensions have been achieved, but they ultimately lead to poor film quality.

Thus, there remains a need in the art for high quality silicon nanocrystal films and methods of making the same.

SUMMARY

In one aspect, the present disclosure provides a silicon nanocrystal ink. In one embodiment the silicon nanocrystal ink includes partially halide-terminated nanocrystals of silicon or an alloy thereof (e.g., partially chloride-terminated silicon nanocrystals) in an organic solvent that is effective to form a colloidal dispersion of the nanocrystals. In certain embodiments the partially halide-terminated nanocrystals are halide- and hydrogen-terminated nanocrystals of silicon or an alloy thereof (e.g., chloride and hydrogen-terminated nanocrystals of silicon or an alloy thereof). In certain embodiments, the ink includes at least $1\times10^{-5}$ volume fraction of the partially halide-terminated nanocrystals of silicon or an alloy thereof, in certain embodiments at least $1\times10^{-3}$ volume fraction, and in some certain embodiments at least $1\times10^{-1}$ volume fraction of the partially halide-terminated nanocrystals of silicon or an alloy thereof. In certain embodiments, the organic solvent is a polar (e.g., dipolar), organic solvent having a hard Lewis base site (e.g., donor group), without a strongly acidic site, and does not chemically react with the nanocrystal surface. In some embodiments the solvent has a largest dimension of at most 1.5 nm, and in certain embodiments a largest dimension of at most 1 nm, and in some certain embodiments a largest dimension of at most 0.5 nm. Suitable solvents include, but are not limited to, halogenated aromatics (e.g., 1,2-dichlorobenzene), ketones (e.g., methyl alkyl ketones such as 2-butanone), esters, N-substituted pyrrolidinones, nitriles (e.g., benzonitrile), and combinations thereof.

In another embodiment, the present disclosure provides a silicon nanocrystal ink that includes at least $1\times10^{-5}$ volume fraction of non-agglomerated nanocrystals of silicon or an alloy thereof in an organic solvent that is effective to form a colloidal dispersion of the nanocrystals, wherein the nanocrystals are free of organic ligands and surfactants. In certain embodiments the nanocrystals are partially halide-terminated nanocrystals of silicon or an alloy thereof (e.g., partially chloride-terminated nanocrystals of silicon or an alloy thereof). In certain embodiments the partially halide-terminated nanocrystals are halide- and hydrogen-terminated nanocrystals of silicon or an alloy thereof (e.g., chloride and hydrogen-terminated nanocrystals of silicon or an alloy thereof). In certain embodiments, the inks include at least $1\times10^{-3}$ volume fraction, and in some certain embodiments at least $1\times10^{-1}$ volume fraction of the partially halide-terminated nanocrystals of silicon or an alloy thereof. In certain embodiments, the organic solvent is a polar (e.g., dipolar), organic solvent having a hard Lewis base site (e.g., donor group), without a strongly acidic site, and does not chemically react with the nanocrystal surface. In some embodiments the solvent has a largest dimension of at most 1.5 nm, and in certain embodiments a largest dimension of at most 1 nm, and in some certain embodiments a largest dimension of at most 0.5 nm. Suitable solvents include, but are not limited to, halogenated aromatics (e.g., 1,2-dichlorobenzene), ketones (e.g., methyl alkyl ketones such as 2-butanone), esters, N-substituted pyrrolidinones, nitriles (e.g., benzonitrile), and combinations thereof.

In another aspect, the present disclosure provides a method of preparing silicon nanocrystal inks, and the silicon nanocrystal inks prepared thereby. In one embodiment, the method includes combining partially halide-terminated nanocrystals of silicon or an alloy thereof (e.g., partially chloride-terminated nanocrystals of silicon or an alloy thereof) with an organic solvent under conditions effective to form a colloidal dispersion of the nanocrystals (e.g., gentle mixing or sonication at room temperature). In certain embodiments the partially halide-terminated nanocrystals are halide- and hydrogen-terminated nanocrystals of silicon or an alloy thereof (e.g., chloride and hydrogen-terminated nanocrystals of silicon or an alloy thereof). In certain embodiments, the organic solvent is a polar (e.g., dipolar), organic solvent having a hard Lewis base site (e.g., donor group), without a strongly acidic site, and does not chemically react with the nanocrystal surface. In some embodiments the solvent has a largest dimension of at most 1.5 nm, and in certain embodiments a largest dimension of at most 1 nm, and in some certain embodiments a largest dimension of at most 0.5 nm. Suitable solvents include, but are not limited to, halogenated aromatics (e.g., 1,2-dichlorobenzene), ketones (e.g., methyl alkyl ketones such as 2-butanone), esters, N-substituted pyrrolidinones, nitriles (e.g., benzonitrile), and combinations thereof.

In another aspect, the present disclosure provides silicon nanocrystal films. Such silicon nanocrystal films can be useful, for example, for fabricating semiconductor devices such as solar cells, transistors, photodetectors, and light emitting diodes.

In one embodiment, the present disclosure provides a silicon nanocrystal film having an area of at least 9 cm$^2$ that exhibits no cracks observable by scanning electron microscopy (SEM), atomic force microscopy (AFM), or optical microscopy, wherein the nanocrystals comprise silicon or an alloy thereof and are free of organic ligands and surfactants. In some embodiments, the silicon nanocrystal film is cast on a wafer having a largest dimension of at least 4 inches and exhibits no cracks observable by SEM, AFM, or optical microscopy. In certain embodiments the silicon nanocrystals are partially halide-terminated nanocrystals of silicon or an alloy thereof (e.g., partially chloride-terminated nanocrystals of silicon or an alloy thereof). In certain embodiments the partially halide-terminated nanocrystals are halide- and hydrogen-terminated nanocrystals of silicon or an alloy thereof (e.g., chloride and hydrogen-terminated nanocrystals of silicon or an alloy thereof). In certain embodiments the nanocrystals are free of oxides and/or free of organic ligands and surfactants.

In another embodiment, the present disclosure provides a silicon nanocrystal film that includes partially halide-terminated nanocrystals of silicon or an alloy thereof (e.g., partially chloride-terminated nanocrystals of silicon or an alloy thereof). In certain embodiments, the film has an area of at least 9 cm$^2$ that exhibits no cracks observable by SEM, AFM, or optical microscopy. In some embodiments, the silicon nanocrystal film is cast on a wafer having a largest dimension of at least 4 inches and exhibits no cracks observable by SEM, AFM, or optical microscopy. In certain embodiments the partially halide-terminated nanocrystals are halide- and hydrogen-terminated nanocrystals of silicon or an alloy thereof (e.g., chloride and hydrogen-terminated nanocrystals of silicon or an alloy thereof). In certain embodiments the nanocrystals are free of oxides and/or free of organic ligands and surfactants.

In another aspect, the present disclosure provides a method of making silicon nanocrystal films, and the silicon nanocrystal films prepared thereby. In certain embodiments, the method includes solution coating a silicon nanocrystal ink as described herein. Suitable solution coating methods include, but are not limited to, drop casting, spin coating, dip coating, Mayer rod coating, doctor blade coating, inkjet printing, screen printing, contact printing, and combinations thereof. The method can further include allowing the organic solvent to evaporate at a temperature of at most 250° C. In certain embodiments, the film is formed without heating to a temperature greater than 250° C. to anneal the film. Optionally, the method can further include heating the film to at most 350° C. to remove the halide.

In another aspect, the present disclosure provides a method of preparing an amine-terminated silicon nanocrystal film, and the amine-terminated silicon nanocrystal films prepared thereby. In one embodiment the method includes: providing a silicon nanocrystal film that includes partially halide-terminated nanocrystals of silicon or an alloy thereof as described herein; and contacting an amine with the nanocrystal film under conditions effective to replace at least a portion of the halides and form an amine-terminated nanocrystal film of silicon or an alloy thereof. In certain embodiments, the amine is selected from the group consisting of ammonia, primary amines, secondary amines, tertiary amines, hyrdazine, and combinations thereof. Conditions effective can include plasma, gas, or liquid at a temperature of at most 350° C.

DEFINITIONS

Unless otherwise specified, "a," "an," "the," and "at least one" are used interchangeably and mean one or more than one.

As used herein, the term "comprising," which is synonymous with "including" or "containing," is inclusive, open-ended, and does not exclude additional unrecited elements or method steps.

As used herein, "nanocrystals" of silicon or an alloy thereof are crystals having a diameter of 1 to 30 nm.

As used herein, an "alloy" of silicon is a composition that includes silicon and another element, preferably another group IV metal such as germanium or tin.

As used herein, "halide" is meant to encompass chloride, fluoride, bromide, and iodide.

As used herein, nanocrystals that are "free of oxides" are meant to include nanocrystals that have no more than a monolayer of oxygen atoms at the surface of each nanocrystal. Preferably no oxide is detectable on the surface of the nanocrystal by Fourier transform infrared spectroscopy. Other techniques for determining surface composition include atomic emission spectroscopy, sputtered X-ray photoelectron spectroscopy, sputtered auger electron spectroscopy, and combinations thereof.

As used herein, nanocrystals that are "free of organic ligands and surfactants" are meant to include nanocrystals that have no more than 50% of the nanocrystal surface covered by organic ligands and surfactants, preferably no more 10% of the nanocrystal surface covered by organic ligands and surfactants, and most preferably no organic ligands and surfactants are detectable by Fourier transform infrared spectroscopy. Other techniques for determining surface composition include atomic emission spectroscopy, sputtered X-ray photoelectron spectroscopy, sputtered auger electron spectroscopy, and combinations thereof.

As used herein, the phrase "non-agglomerated nanocrystals" is meant to mean that any clusters or masses of nanocrystals contain no more 50 nanocrystals, and preferably no clusters or masses of nanocrystals are detectable by dynamic light scattering. Nanocrystal size can also be determined by techniques such as transmission electron microscopy (TEM) or Scherrer broadening in the X-ray diffraction (XRD) spectrum.

The above brief description of various embodiments of the present invention is not intended to describe each embodiment or every implementation of the present invention. Rather, a more complete understanding of the invention will become apparent and appreciated by reference to the following description and claims in view of the accompanying drawings. Further, it is to be understood that other embodiments may be utilized and structural changes may be made without departing from the scope of the present invention.

DETAILED DESCRIPTION OF ILLUSTRATIVE EMBODIMENTS

Figure 1A:
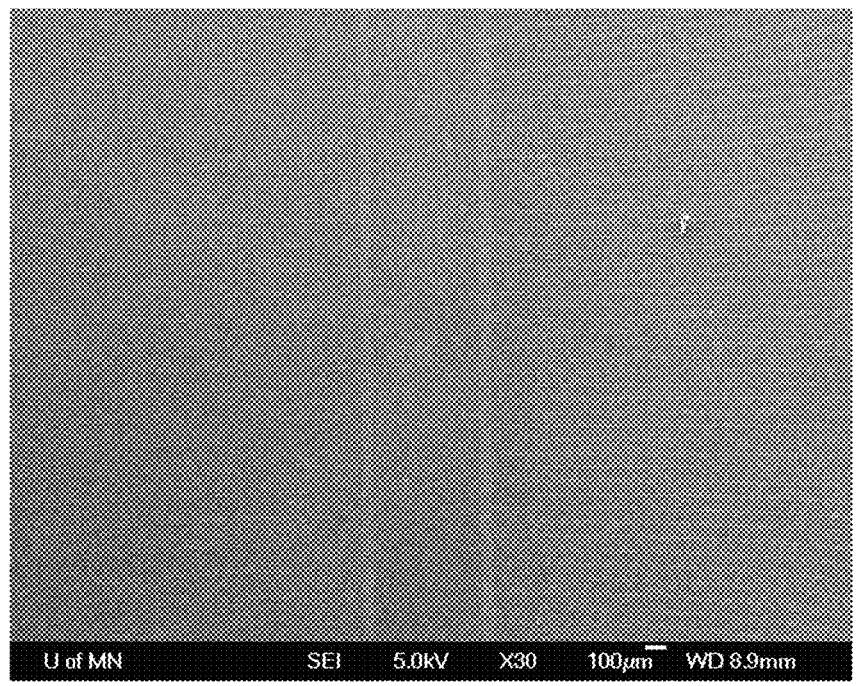
FIGS. 1A-1L illustrate scanning electron micrograph (SEM) top-views of films cast from the Cl/H-terminated Si nanocrystal dispersions and exhibit no observable cracks. (A) 30× electrode interdigitated; (B) 55× with intentional scrape; (C) 300×, 400C; (D) and (E) 300×, 400C with no electrodes; (F) 300×, electrode with edge burnt; (G)-(J) 300× electrode interdigitated; (K) 300× with intentional scrape; (L) 300×, thicker film. The films in FIGS. 1A-1D and 1H were not annealed. The films in FIGS. 1E-1G and 1I-1L were annealed at 700° C., and no cracks were observed after annealing at this temperature.
Figure 1B:
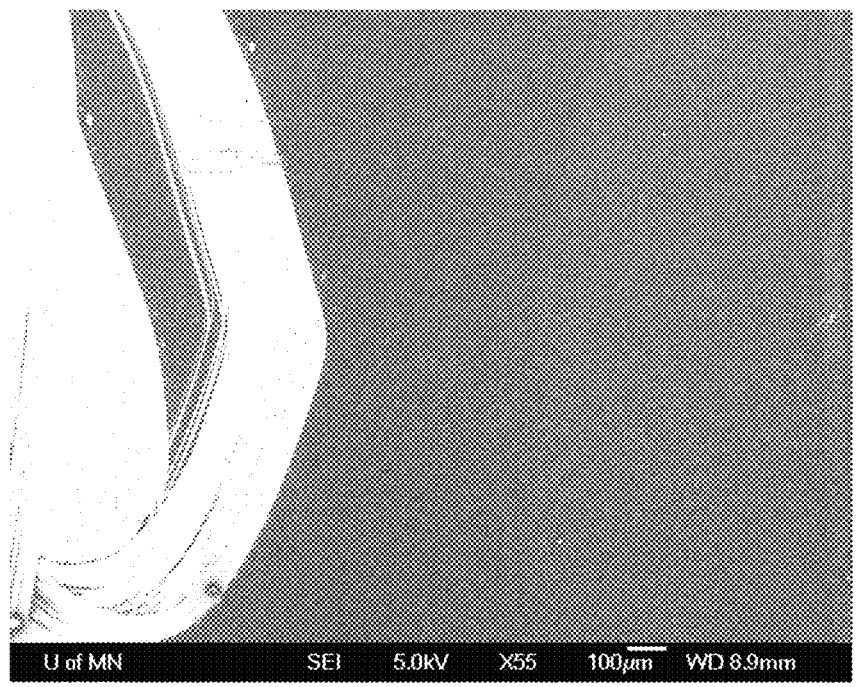
Figure 1C:
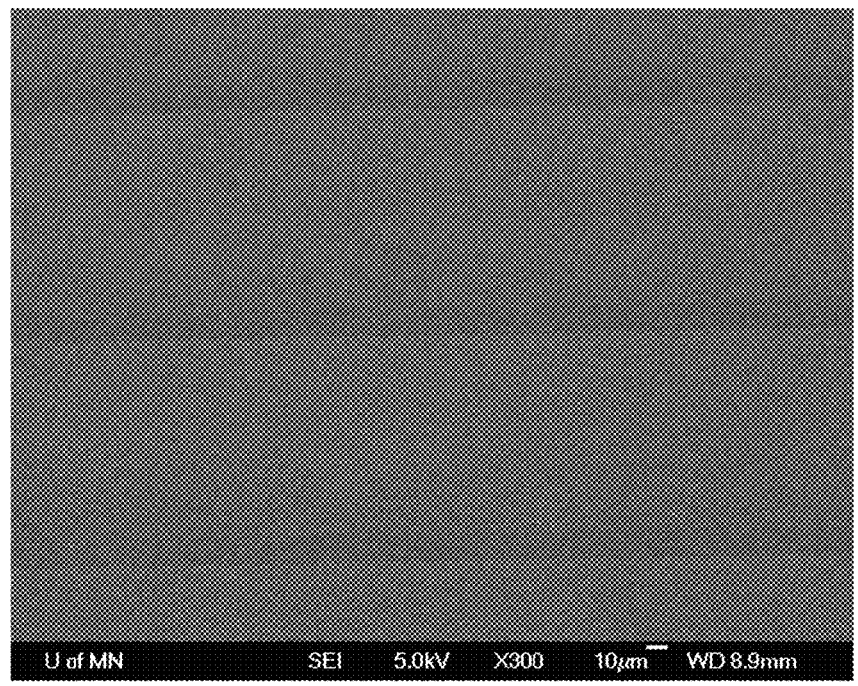
Figure 1D:
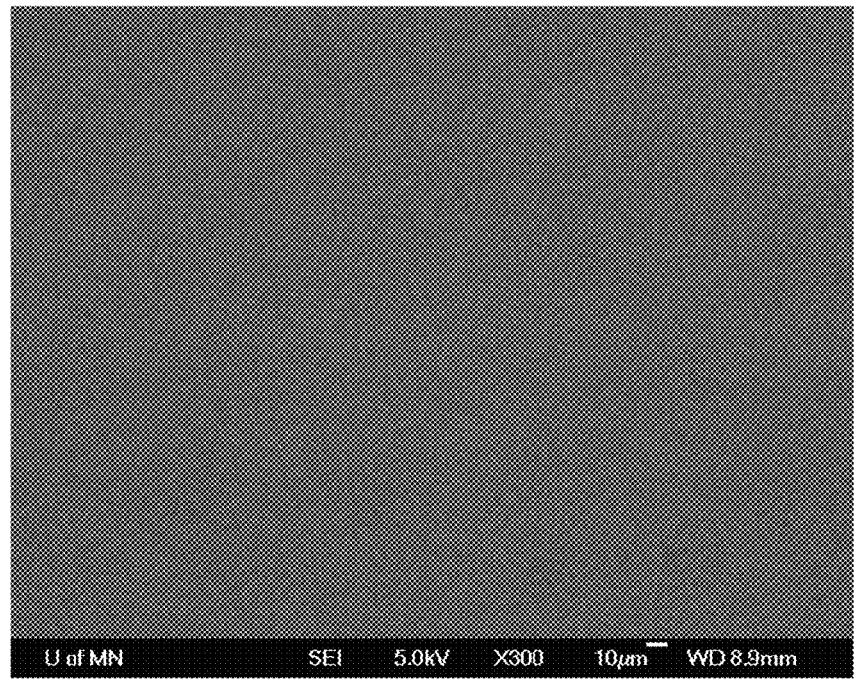
Figure 1E:
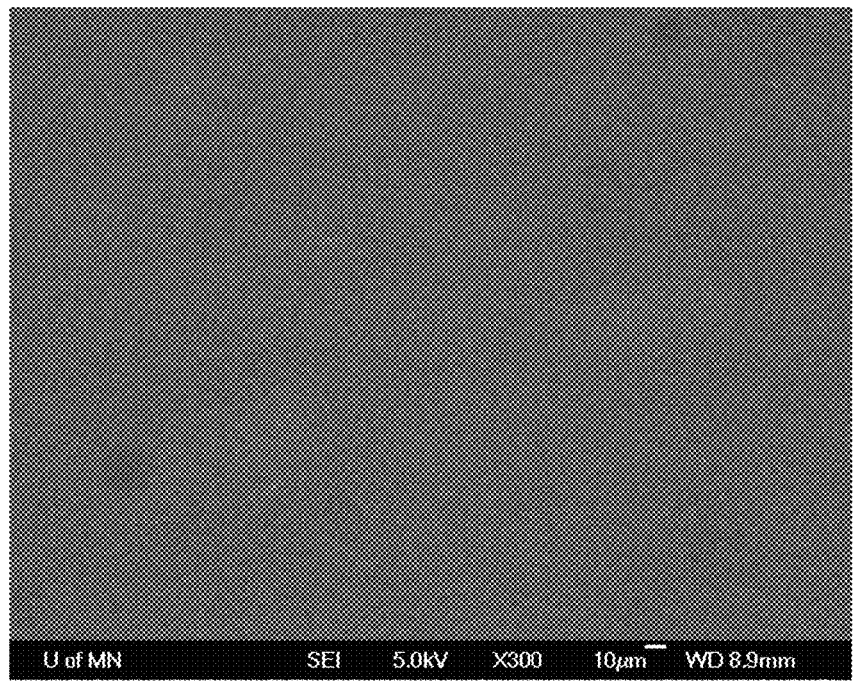
Figure 1F:
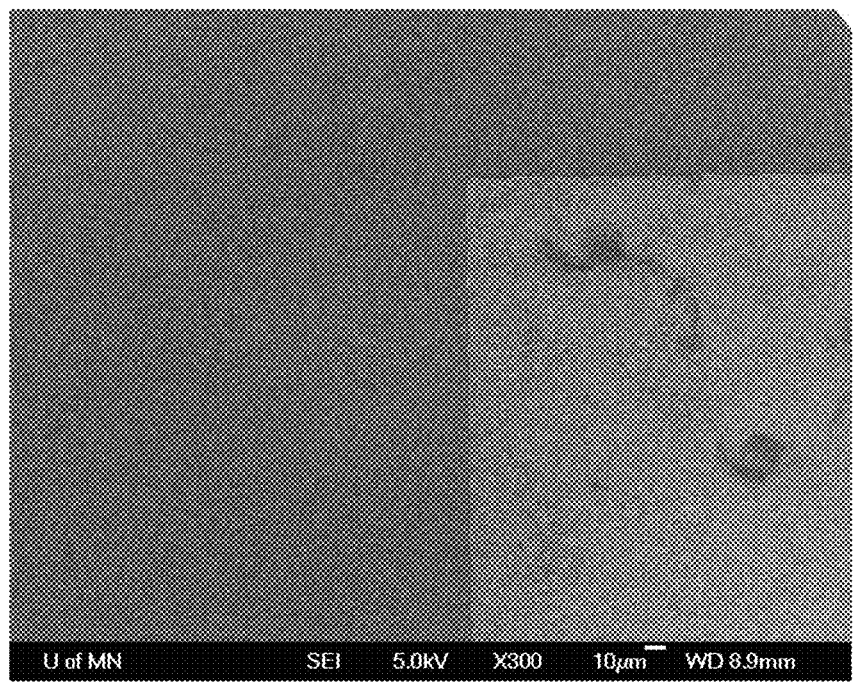
Figure 1G:
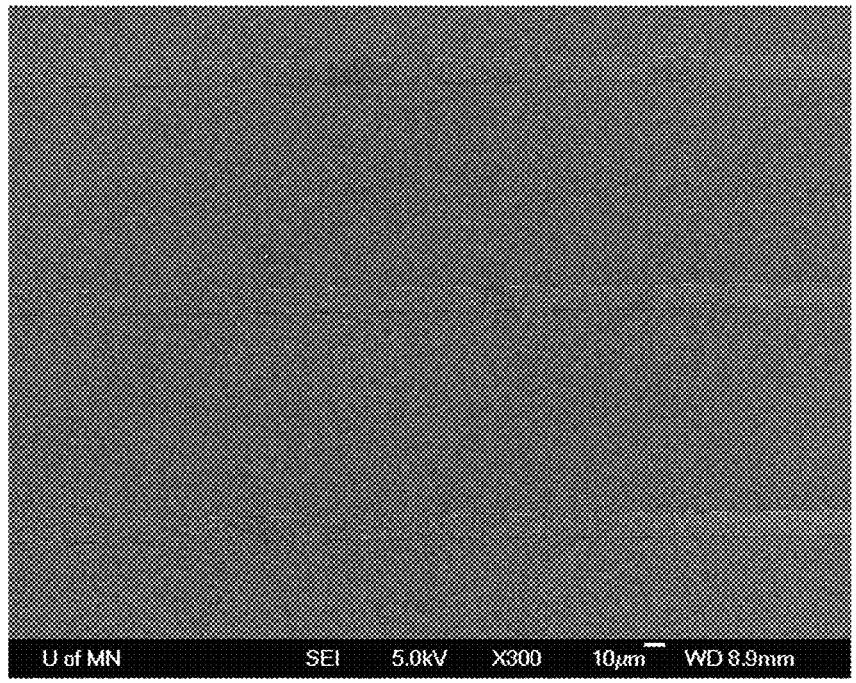

Synthesizing nanocrystals from silicon tetrachloride results in a partially-chlorinated surface that facilitates a novel colloidal stabilization in aprotic polar solvents. Thin films cast from these colloids demonstrate smooth and continuous film morphology. Electrical characterization further illustrates chloride-terminated silicon nanocrystals as an attractive thin film technology.

Nanocrystals of silicon or an alloy thereof can be prepared by a variety of methods. Specifically, nanocrystals of silicon or an alloy thereof can be prepared by methods using a plasma reactor similar to those disclosed in U.S. Pat. No. 7,446,335 B2 (Kortshagen et al.). For one example, an RF power can be applied to ring electrodes on an alumina tube to decompose $SiH_4$ in the presence of argon to prepare silicon nanocrystals that are terminated by hydrogen atoms. For another example, an RF power can be applied to ring electrodes on an alumina tube to decompose $SiCl_4$ in the presence of $H_2$ and argon to prepare silicon nanocrystals that are partially terminated by chlorine atoms (e.g., terminated by chlorine atoms and hydrogen atoms). The nanocrystals can be collected downstream of the reaction on stainless steel mesh or via inertial impaction onto a substrate to form a densely packed cone or thin film. The nanocrystals can then be transferred into a $N_2$-purged glovebox for further processing. In the glovebox, the nanocrystals can be weighed and transferred to a container (e.g., a vial) to which a solvent can be added.

It has previously been disclosed that 1,2-dichlorobenze can be added to hydrogen-terminated silicon nanocrystals followed by sonication to inhibit flocculation so that a stable, though not optically transparent, suspension is formed, in which the Si nanocrystals are suspended as agglomerates. See, for example, Holman et al., *Nano Letters* 2010, 10:2661-2666; and Liu et al., *Nano Letters* 2009, 9:449-452.

The present inventors have discovered that by selecting particular silicon nanocrystals (e.g., partially halide-terminated nanocrystals of silicon or an alloy thereof such as partially chloride-terminated nanocrystals of silicon or an alloy thereof) and particular solvents, as further discussed herein below, optically transparent colloidal dispersions can be prepared having sufficient concentrations of nanocrystals to be useful as silicon nanocrystal inks. The presence of chlorine during plasma synthesis allows for tuning of the surface chemistry of the silicon nanocrystals. With chlorine and some hydrogen at the surface, the silicon nanocrystals can be readily dispersed in polar aprotic solvents such as benzonitrile or 1,2-dichlorobenzene (DCB). Solutions of chloride-terminated nanocrystals of silicon or an alloy thereof can assemble into dense, continuous films that do not require a post-treatment to remove ligands.

Solvents can be selected that interact favorably with the surface of the partially halide-terminated nanocrystals of silicon or an alloy thereof. The halide (e.g., chloride or fluoride) on the surface is electron-withdrawing. The inductive effect of the electron-withdrawing halide can lead to an acidic (electron deficient) site on the surface of the nanocyrstal. As a result, selection of a solvent that has a basic group (e.g., an electron donating group) on it can be important for dispersibility of the nanocrystals. Suitable solvents should also be polar (e.g., dipolar) and not react with the surface under conditions used to prepare the ink. Ketones and nitriles fall nicely into this category, with the carbonyl and nitrile groups acting as electron-donating groups. They are inexpensive and widely used. 2-Butanone and benzonitrile can form highly concentrated dispersions—as high as 7 mg/ml or higher. Multiple solvents that fit this category can be used in combinations. After dispersion, the resulting solution may need filtration, but if butanone or the like are used, then it is typically unnecessary below approximately 7 mg/ml.

The mechanism of stability may be important because it allows for depositing films of nanocrysals that are not separated by an electrically-insulating ligand, which is the case for many known nanocrystal films. However, because the presently disclosed inks of partially-halide terminated nanocrystals of silicon or an alloy thereof are believed to be stabilized by a "solvation" effect, the nanocrystals can assemble into a film in which the nanocrystals are already electronically coupled. This allows for the assembly and formation of functional nanocrystal films with, at most, a gentle anneal (e.g., a temperature at or below the boiling point of the solvent), without a need for involving ligand exchange chemistry.

The following factors should be considered in the selection of solvents that facilitate colloidal stability. In addition to proper length, (1) the solvent should be polar (e.g., dipolar); (2) a non-reactive, hard Lewis base site (e.g., a hard donor group such as a carbonyl or a nitrile should be present, because soft donors such as thiols and phosphines may not provide adequate stability); (3) a strong acidic site should not be present on the molecule, because acidic sites may interact more favorably with one another instead with the nanocrystal surface; and (4) the solvent should not chemically react with the nanocrystal surface, so that the acidic surface can remain intact. Solvents may have a branched or cyclic carbon structure. Two-solvent systems may also be stable as long as each solvent will stabilize the Si nanocrystals independently. These and other factors are further discussed in the examples.

Silicon nanocrystal inks can conveniently be coated on a substrate to form a film of the silicon nanocrystals. The surfaces can be coated from colloidal dispersions of nanocrystals (i.e., inks) using a variety of methods including, but not limited to, drop casting, spin coating, dip coating, Mayer rod coating, doctor blade coating, inkjet printing, screen printing, contact printing, and/or combinations thereof.

For example, after a stable colloid is achieved, two methods of deposition are described herein: spin- and drop-casting. The scanning electron micrograph (SEM) showing the approximately 70 nm cross-section is achieved by spin-casting at 700 rpm for 1 minute from a 2 mg/ml dispersion. These parameters can easily be tuned to achieve different thicknesses. The greater than 2 micron-thick film is deposited by drop-casting. That is, a drop of the colloidal dispersion is placed on a substrate, a small funnel is placed over it for favorable drying kinetics, and it is allowed to dry. Thinner films, such as the approximately 70 nm film, can also be achieved by drop-casting.

No cracks were observed in scanning electron micrographs (SEMs) of a film of partially chloride-terminated silicon nanocrystals. The SEM cross-section images showing approximately 70 nm thickness and atomic probe microscopy image of the surface showing a surface roughness of approximately 8 nm demonstrate that the nanocrystals were "solvated" as independent nanocrystals—not as agglomerates, because a thin film of these characteristics could not otherwise be achieved. The films can be continuous, have a uniform thickness (e.g., +/−10 nm), and can be free of observable pin-holes (i.e., a hole that goes through the thickness of the film).

The film deposition techniques used herein demonstrate the feasibility of large-scale, wide-area techniques including, for example, screen-printing, ink-jet printing, wide-area dip-coating, doctor blade casting, and the like.

FIGS. 1A-1L illustrate SEM top-views of films cast from the Cl/H-terminated Si nanocrystal dispersions. The films were cast onto a Si wafer with Al interdigited electrodes, and the films were then annealed at 700° C. Some of the figures do not show the electrodes. There are a few that have an area intentionally scraped off to show the location of the film, which can be difficult to observe because it is so smooth and continuous.

In contrast to the films of partially chloride-terminated silicon nanocrystals shown in FIGS. 1A-1L that exhibit no observable cracks, films of silicon nanocrystals with long-chain organic ligands exhibit many observable cracks as shown in FIGS. 2-8, at the same or lower magnification as FIGS. 1A-1L. The films were prepared from 5 nm H-terminated Si nanocrystals functionalized with 1-dodecene, spin-cast, and heated for 2 minutes at 700° C. under forming gas (i.e., 5% hydrogen gas diluted in nitrogen).

The Si nanocrystal surface can be passivated with Cl and H to varying degrees after casting from the stable dispersion into a film. This surface is conveniently accessible for further functionalization to achieve, for example, a more robust film for optoelectronic device integration (e.g., to render the film air stable or enhance optoelectronic properties).

Hydrogen passivation can be achieved with a liquid-phase HF dip, or an HF vapor exposure; however hydrogen passivation does not lead to air stability. Other functionalization schemes can employ C, N, and, O. Monovalent $NH_2$ termination has been shown to enhance optoelectronic properties of Si nanocrystals (Salivati et al., *Journal of Physical Chemistry C* 2010, 114:16924-16928; Salivati et al., *The Journal of Physical Chemistry Letters* 2010, 1(13):1957-1961; Martinez et al., *J. Phys. Chem. C* 2010, 114:12427-12431; and Uchida et al., *Phys. Status Solidi C* 2011, 8:3017-3020) as well as provide a barrier to oxidation (Zaitseva, et al., *J. Phys. Chem. C* 2008, 112:3585-3590). SiN is also one current passivation layer of choice for bulk Si-based solar cells due to its ability to passivate unwanted surface defects that can lead to recombination (Aberle, *Progress in Photovoltaics: Research and Applications* 2000, 8:473-487).

There are multiple routes to achieving these passivation options. For example, a Cl-terminated Si surface is well known to be reactive with ammonia and its derivatives without activation. Placing a film in an evacuated chamber while flowing gaseous ammonia into the chamber with optional heating could carry out a reaction to achieve $NH_2$ passivation. $NH_2$ passivation could also be achieved in a process in which the film is put in a vacuum chamber and treated with an ammonia plasma.

Liquid-phase reactions are attractive because they can be cost-effective. A layer-by-layer process, analogous to that which is widely used in metal chalcogenide nanocrystal systems (Law et al., *J. Am. Chem. Soc.* 2008, 130:5974-5985), could be used to build up a film of nanocrystals with the desired surface chemistry. This can be done by dipping a substrate into a stable dispersion of nanocrystals to deposit one or more monolayers of nanocrystals, followed by dipping the substrate into a solution to exchange the native ligand for something else via acid-base exchange (Owen et al., *J. Am. Chem. Soc.* 2008, 130:12279-12281). Repeating the process can lead to the assembly of films of a desired thickness. A similar strategy could be employed with the stable SiNCs, except instead of exchanging an acid-base complex, one could react the Cl surface to form a covalent bond. To achieve $NH_2$ passivation, hydrazine could be the reactive component in the "exchange" solution. A gas or plasma phase doping treatment could also be performed by similar methods.

Alternatively, a process that involves layer-by-layer assembly of films that alternates dipping in a colloidal dispersion of Si nanocrystals and then a solvent that is miscible in the stabilizing solvent, but that will not stabilize the nanocrystals, could be used. For example, alternating dipping in a Si nanocrystal dispersion of 2-butanone and neat n-hexane can be used. n-Hexane is miscible in 2-butanone, but will not stabilize the Si nanocrystals. With this method, residual solvent can exist in the cast film, and no anneal would be necessary.

For Si nanocrystal films for optoelectronics, shorter termination moieties may be preferred, although the Cl surface passivation can be further functionalized with organic molecules through an Si—NR linkage as described in Bergerson et al (Bergerson et al., *J. Am. Chem. Soc.* 1999, 121:454-455). Also, alkylation of chlorinated Si surfaces can be achieved via Grignard reactions. The Si—CR linkage could lead to wide variety surface chemistries that include cyclic and conjugated carbon species. See, for example, Clampi et al (Clampi et al., *ChemInform* 2010, Vol. 41, no. doi. 10.1002/chin 201042248). A layer-by-layer strategy to covalently bond the N, O, and C linkages can be employed.

Oxygen is known to provide beneficial properties as a passivation layer on Si. In chlorine-terminated Si nanocrystals, photoluminescence quantum yield is increased to 50% from nearly zero after oxidation; in contrast H-passivated Si nanocrystals have approximately a 5% photoluminescence quantum yield. Similar trends are also seen in F-terminated Si nanocrystals. Oxidation can greatly enhance optoelectronic properties of silicon nanocrystals.

The Si nanocrystals could be embedded into a matrix of a higher bandgap material such as ZnO, $Al_2O_3$, or ZnS. which could likely be achieved by atomic layer deposition (ALD), as has been demonstrated in metal chalcogenide systems (Liu et al., *Nano Lett.* 2011, 11:5349-5355).

Surface chemistries could also be used to "dope" the nanocrystal film. N-type dopants such as P, As, and Sb could be applied to the surface using gas- or liquid phase techniques as described herein above. Gases and liquids that could achieve P, As, and Sb doping include, for example, $PBr_3$ (liquid), $AsH_3$ (gas), and $SbH_3$ (gas), respectively. P-type dopant sources include, for example, $BBr_3$ (liquid) and $AlCl_3$ (liquid). Such dopant compounds could be applied to the cast film as a vapor/gas or a liquid and an anneal step could drive the dopants into the film. In addition, because $PBr_3$ is polar molecule, small amounts may be soluble in stable Si nanocrystal dispersions in the solvents disclosed herein.

A stable colloidal dispersion of silicon nanocrystals in a trioctylphosphine/trioctylphosphine oxide (TOP/TOPO) mixture has been demonstrated. TOP/TOPO is a solvent environment often used with other material systems such as compound II-VI and IV-VII semiconductor nanocrystal systems. Optionally, these solvents could be decomposed in a secondary treatment to dope the film. The phosphorus in TOP/TOPO could act as a n-type dopant in the film Other inorganic n-type dopant-containing solvents such as phosphorus tribromide ($PBr_3$) as well as p-type solvents such as boron tribromide ($BBr_3$) could be used. A wide variety of known organophosphorus and organoboron compounds could also be used.

The present invention is illustrated by the following examples. It is to be understood that the particular examples, materials, amounts, and procedures are to be interpreted broadly in accordance with the scope and spirit of the invention as set forth herein.

EXAMPLES

Example 1

Figure 16:
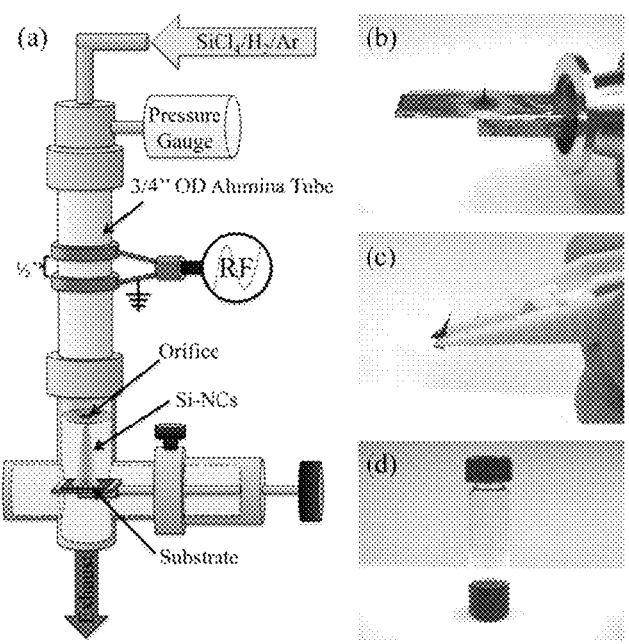
FIG. 16 illustrates (a) Si nanocrystal reactor schematic, and (b-d) photographs of steps taken for Si nanocrystal colloid formation.

Si nanocrystals were synthesized in a flow-through plasma reactor as shown schematically in FIG. 16. Argon (30 standard cubic centimeters per minute (sccm), hydrogen (20 sccm), and silicon tetrachloride vapor (4 sccm) were injected into a ¾-inch outer diameter alumina tube. The precursors dissociated, and the products chemically nucleated to form nanocrystals. The pressure in the reactor was approximately 5.5 torr. Pressure and flow rates determined the residence time and, thus, the eventual size of the Si nanocrystals. Sizes ranging from 4 to 18 nm were produced.

A plasma was ignited by applying 210 W of radiofrequency power at 13.56 MHZ to a pair of ring electrodes separated by 1 cm. 210 W corresponds to the highest crystal fraction of the Si nanocrystals according to Raman spectroscopy.

An orifice was placed downstream of the plasma After synthesis, Si nanocrystals were accelerated through the orifice and collected with a previously developed gas-phase impaction technique, which allowed for deposition onto a variety of substrates (Holman et al., *Nanotechnology*, 2010, 21:335302). The Si nanocrystals formed a high aspect-ratio tower that was dense enough to be transferred to a vile with tweezers. 1 mL of benzonitrile was then added for every 2 mg Si nanocrystals. The solution was centrifuged to remove agglomerates. FIG. 16 provides a photographic progression of the Si nanocrystal colloid formation. Solutions remained stable for at least 1.5 years.

Figure 17:
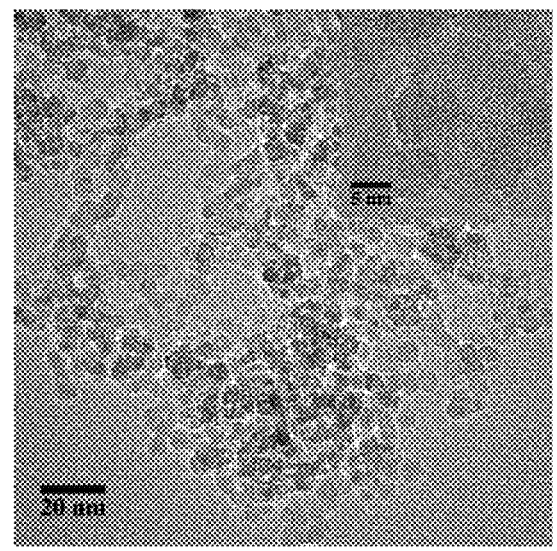
FIG. 17 illustrates TEM images of chlorine and hydrogen terminated Si nanocrystals.

TEM images (FIG. 17) showed a mean diameter of approximately 8 nm with a standard distribution of approximately 10-15%. X-ray diffraction calculations based on Scherrer broadening validated an average crystallite size of approximately 8 nm.

Surface chemistry can be important for Si nanocrystal optoelectrical characteristics; a 5 nm Si nanocrystal will have approximately half of its atoms residing at the surface. As demonstrated here, it can also play a pivotal role in the solvation of Si nanocrystals.

Fourier transform infrared spectroscopy (FTIR) was used to investigate surface chemistry of the Si nanocrystals. Si nanocrystals were impacted directly onto Au-coated Si wafer substrates for characterization. Si nanocrystals synthesized in a quartz tube, showed significant oxidation manifested as the broad O—H peak centered at 3350 cm$^{-1}$, back-bonded Si—O$_x$—H$_y$, at 2250 cm$^{-1}$, and a prominent Si—O—Si stretching mode at 1100 cm$^{-1}$ (Liptak et al., *Appl. Phys.* 2009, 106:064313). All spectra were taken in a nitrogen-purged glovebox.

Figure 18:
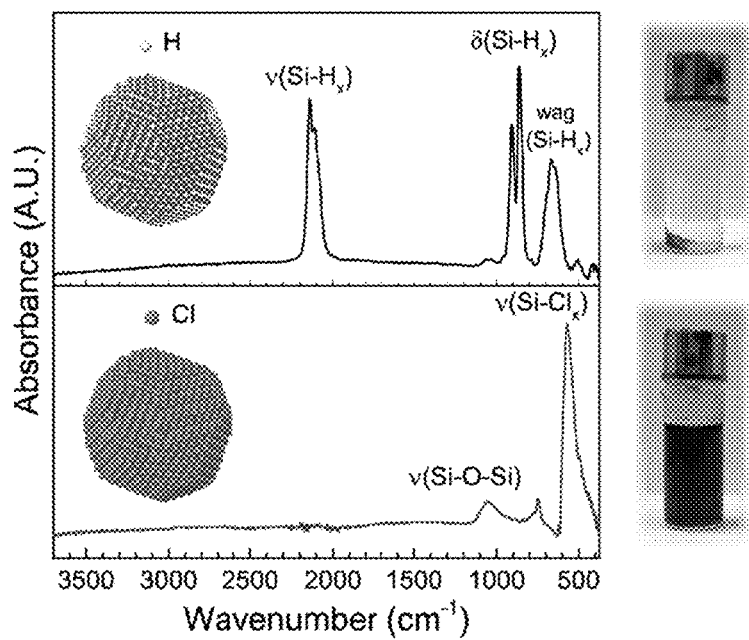
FIG. 18 illustrates Fourier transform infrared (FTIR) spectra of Si nanocrystals synthesized in a nonthermal plasma reactor using silane (e) and $SiCl_4/H_2$ (f). Spectra are normalized to the largest peak. Photographs depict Si nanocrystals after dispersing in 2-butanone and centrifuging. While H-terminated Si nanocrystals do not readily stabilize in solvents, Cl-terminated Si nanocrystals immediately form a highly-concentrated solution.

FIG. 18 illustrates Fourier transform infrared (FTIR) spectra of Si nanocrystals synthesized in a nonthermal plasma reactor using silane (e) and SiCl$_4$/H$_2$ (f). Spectra are normalized to the largest peak. Photographs depict Si nanocrystals after dispersing in 2-butanone and centrifuging. While H-terminated Si nanocrystals do not readily stabilize in solvents, Cl-terminated Si nanocrystals immediately form a highly-concentrated solution.

Switching to a high-purity alumina tube for synthesis dramatically decreased evidence of oxidation, which indicates that oxidation had occurred during synthesis, presumably due to Cl etching of the quartz tube walls. Correspondingly, as the oxide signature decreases, Si—Cl$_x$ stretching modes between 520 cm$^{-1}$ and 580 cm$^{-1}$ become an apparent feature of the spectra (Rivillon et al., *Appl. Phys. Lett.* 2004, 85:2583). The additional presence of Si hydride stretching between 2000 cm$^{-1}$ and 2200 cm$^{-1}$ suggests hydrogen termination on the surface where chlorine or oxygen is not present.

It is possible that colloidal stabilization is derived from the presence of the electronegative Cl on the nanocrystal surface. The colloidal Si nanocrystal solutions are optically transparent, indicating the Si nanocrystals are, if at all, agglomerated to 100 nm clusters or smaller. This feature can be important for favorable film formation.

Thin films were deposited by drop-casting from the Si nanocrystal colloid onto the substrate and allowing them to dry in a nitrogen-purged glovebox. Scanning probe microscopy (SPM) yielded an RMS roughness of approximately 8.6 nm over a 50 μm$^2$ area. This lends evidence to self-assembly of nanocrystals into a dense, long-range-ordered film, without the need for ligand exchange or removal.

Example 2

Figure 9:
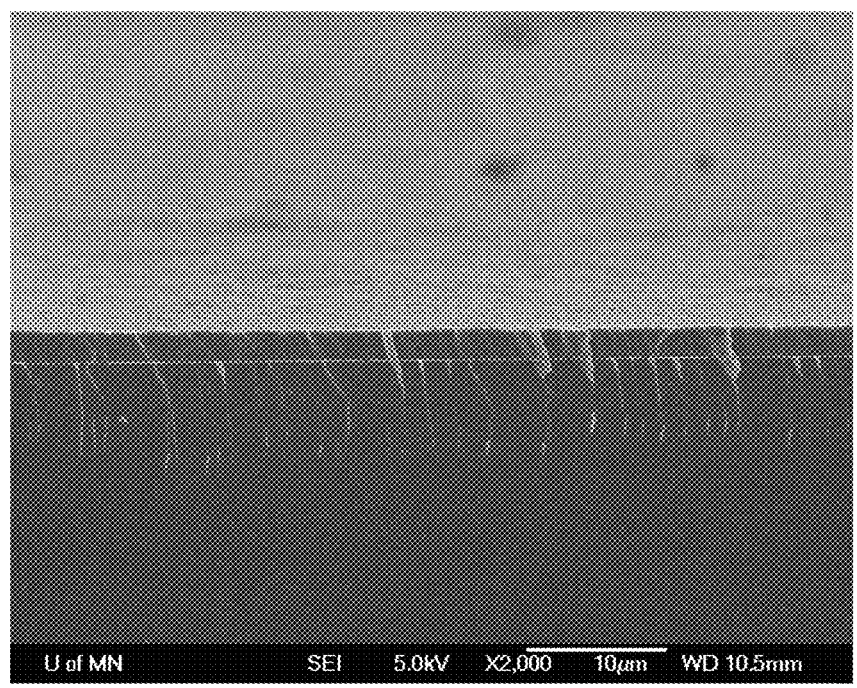
FIGS. 9 and 10 illustrate SEMs of cross sections of a film that was drop-cast from a 5 mg/ml dispersion of 5.5 nm diameter Cl/H-terminated Si nanocrystals in 2-butanone. Films were allowed to dry in a $N_2$-purged glovebox.
Figure 10:
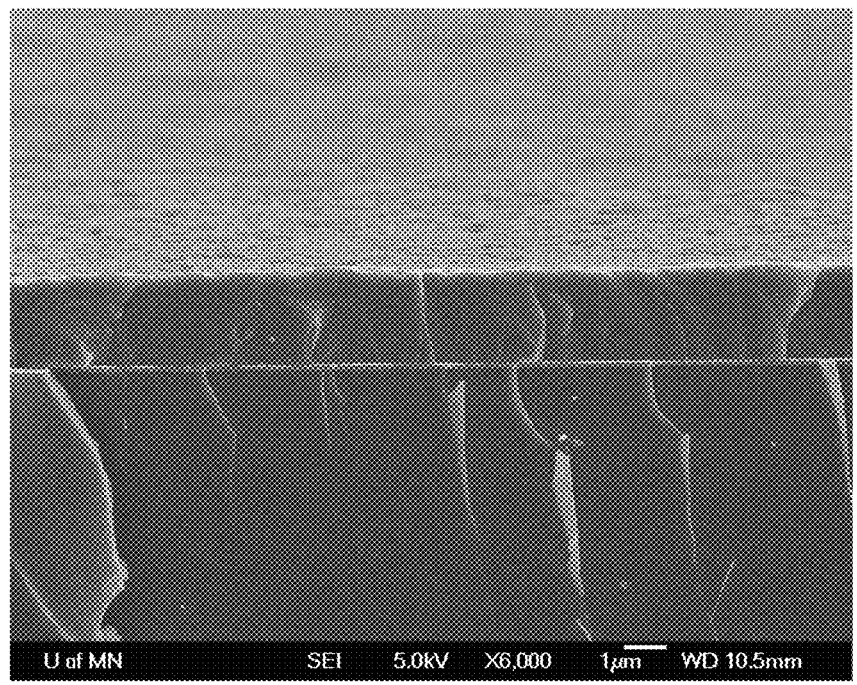

FIGS. 9 and 10 illustrate SEMs of cross sections of a film that was drop-cast from a 5 mg/ml dispersion of 5.5 nm diameter Cl/H-terminated Si nanocrystals in 2-butanone. Films were allowed to dry in a N$_2$-purged glovebox.

Figure 11:
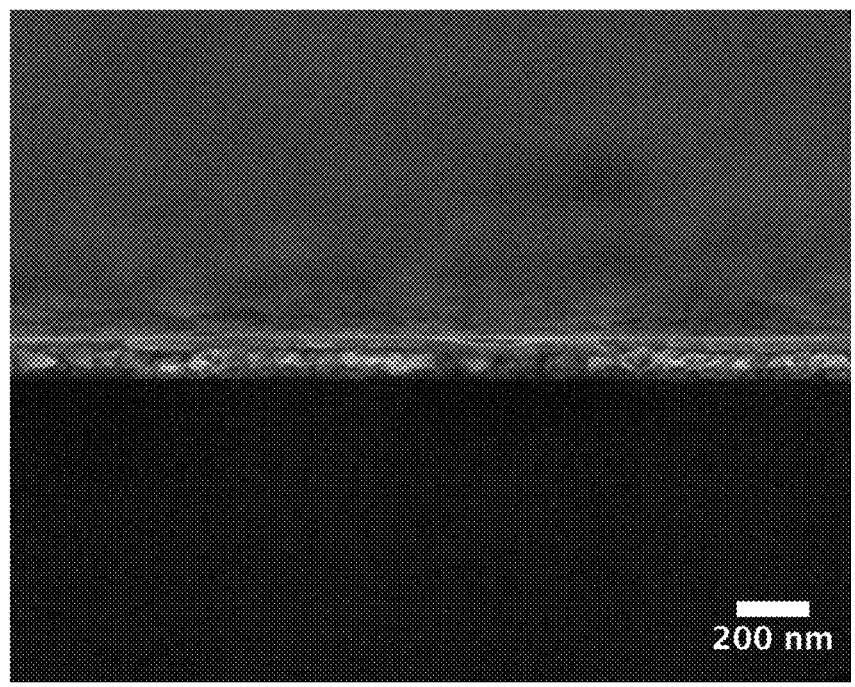
FIGS. 11-13 illustrate SEMs of cross sections of a film that was drop-cast from a 0.05 mg/ml dispersion of Cl/H-terminated Si nanocrystals in 2-butanone. Films were allowed to dry in a $N_2$-purged glovebox.
Figure 12:
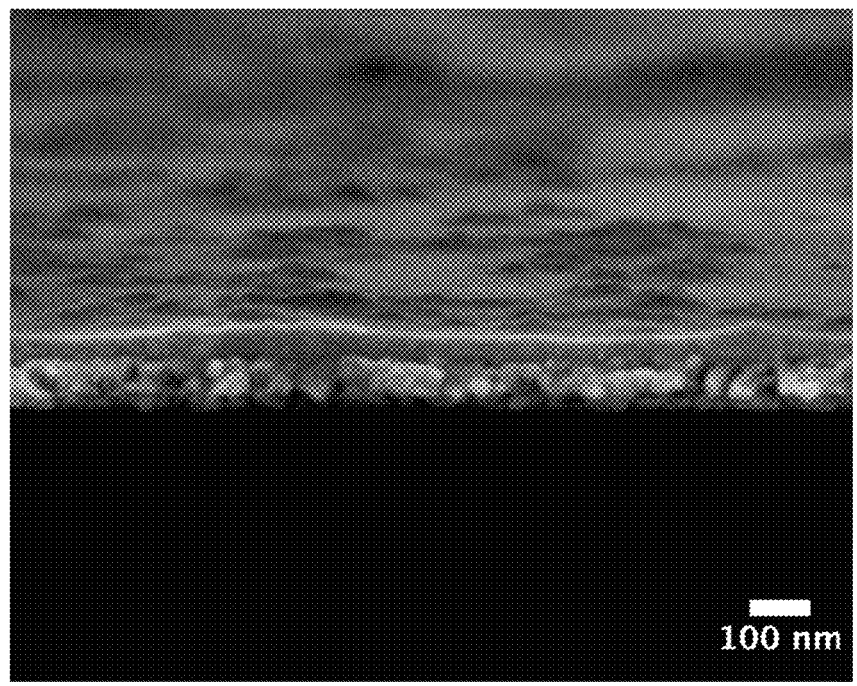
Figure 13:
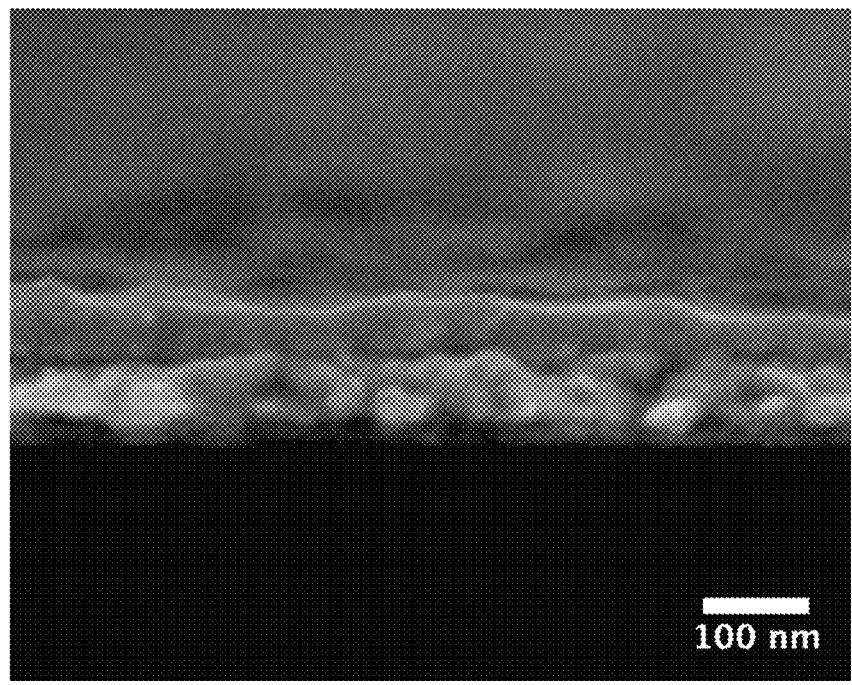
Figure 14:
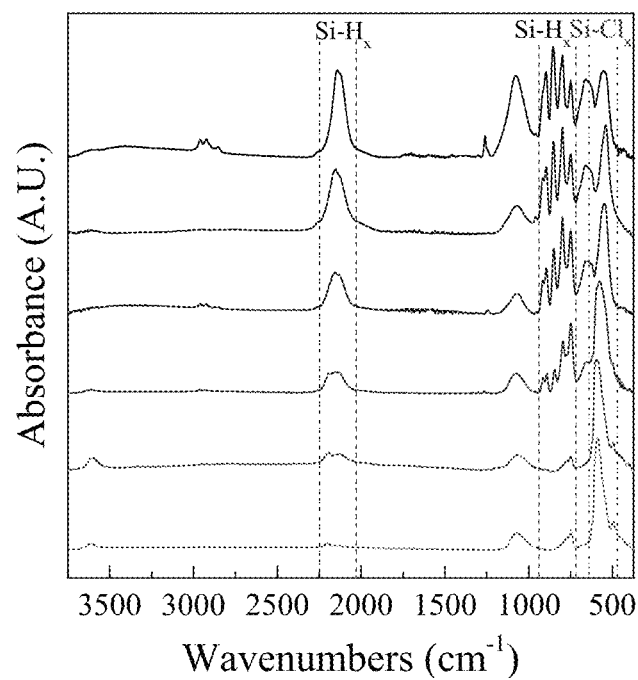
FIG. 14 illustrates an infrared (IR) spectra that shows that surface termination can be controlled by process parameters such as gas ratios.
Figure 15:
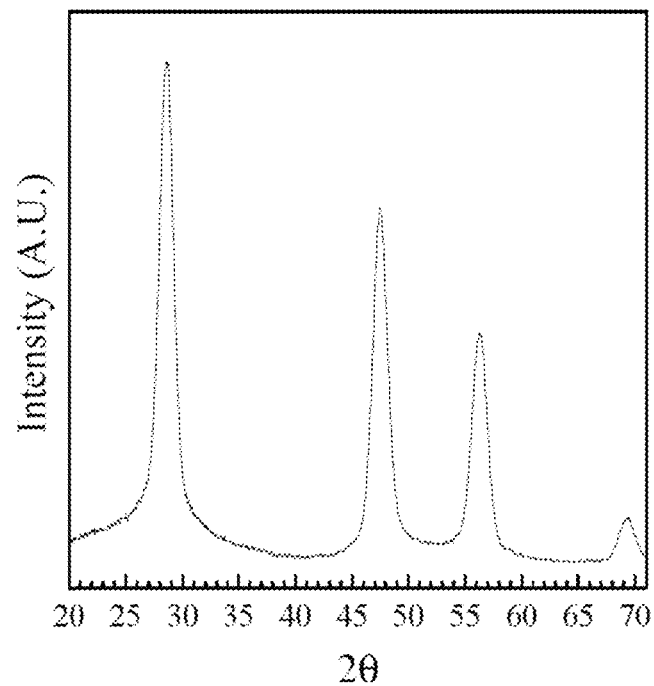
FIG. 15 is an illustration of x-ray diffraction (XRD) spectra that shows that the Si nanocrystal films are crystalline and remain the same size (e.g., 5.5 nm) after they are processed into a film.

FIGS. 11-13 illustrate SEMs of cross sections of a film that was drop-cast from a 0.05 mg/ml dispersion of Cl/H-terminated Si nanocrystals in 2-butanone. Films were allowed to dry in a N$_2$-purged glovebox.

Example 3

Cl-terminated Si nanocrystals were synthesized by flowing 30 sccm of argon, 20 sccm of H$_2$, and 4 sccm SiCl$_4$ into an evacuated plasma reactor depicted in FIG. 16*a* (Mangolini, *Nano Letters* 2005, 5:655-659) and applying a nominal RF power of 200 W at 13.56 Hz to a pair of ring electrodes mounted on an alumina tube (1.90 cm OD, 1.27 ID). The pressure in the reactor was 733 Pa.

Because the chlorinated Si nanocrystal surface is quite reactive to ambient conditions, and all processing was done air-free. Si nanocrystals were collected by impacting them onto a substrate downstream of the plasma. The Si nanocrystals were transferred from the reactor in a vacuum-component assembly pressurized with argon and further processed on a Schlenk line or in an inert-atmosphere glovebox. For UV-Vis absorption, Si nanocrystals were transferred into an ampule and capped with a septum in the glovebox. The capped ampule was removed from the glovebox and a solution was formed by transferring solvent to the ampule via cannula. The nitrogen atmosphere was removed, and the ampule was flame-sealed.

Thin films of Si nanocrystals were assembled by drop-casting onto a Au-coated Si wafer, placing a small funnel over the film to slow evaporation. The SPM topology image was obtained on a Digital Instruments Nanoscope operating in tapping mode with a scan rate of 0.4994 Hz and 512 lines per image.

DLS spectra and electrophoretic mobility were evaluated on a Brookhaven ZetaPALS instrument using phase-angle light scattering with varied conditions between 50 V and 200 V at 2 Hz. Zeta-potential values were evaluated from the electrophoretic mobility by applying Henry's equation at the Smoluchowski limit (Pons, *The Journal of Physical Chemistry B* 2006, 110:20308-20316). Dielectric constants were obtained from the Landolt-Bornstein Database. Since the dielectric constant was unavailable for heptanenitrile, this value was calculated by a linear interpolation between hexanenitrile and octanenitrile.

Figure 30:
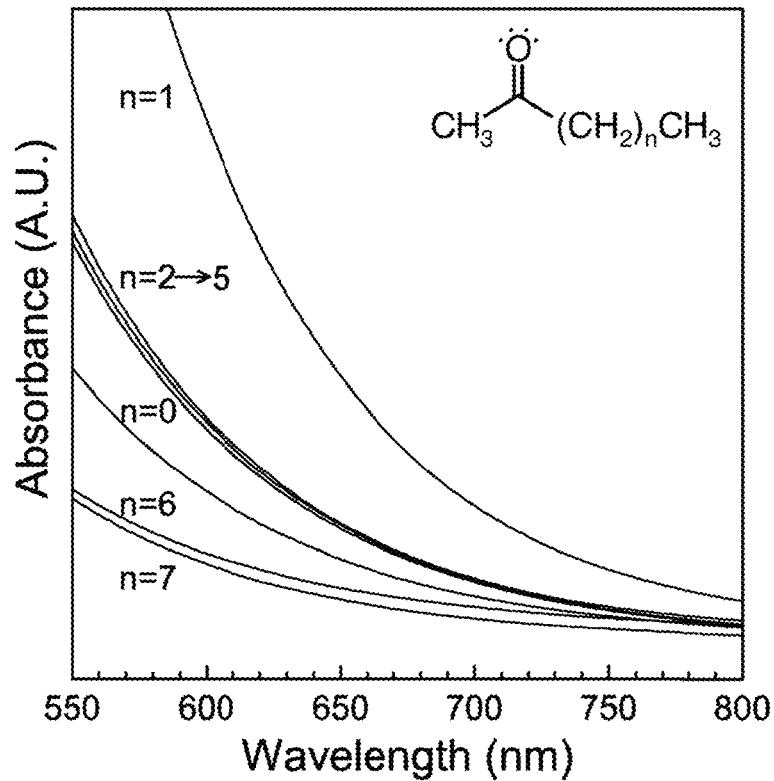
FIG. 30 illustrates UV-Vis absorbance spectra of n-alkanones of varying length, n.
Figure 31:
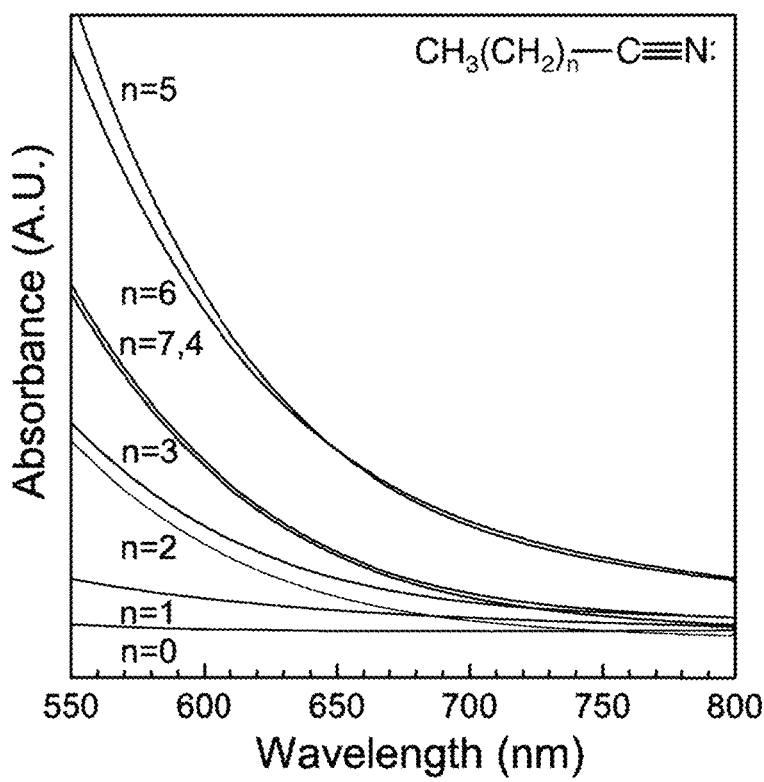
FIG. 31 illustrates UV-Vis absorbance spectra of n-alkanenitriles of varying length, n.
Figure 32:
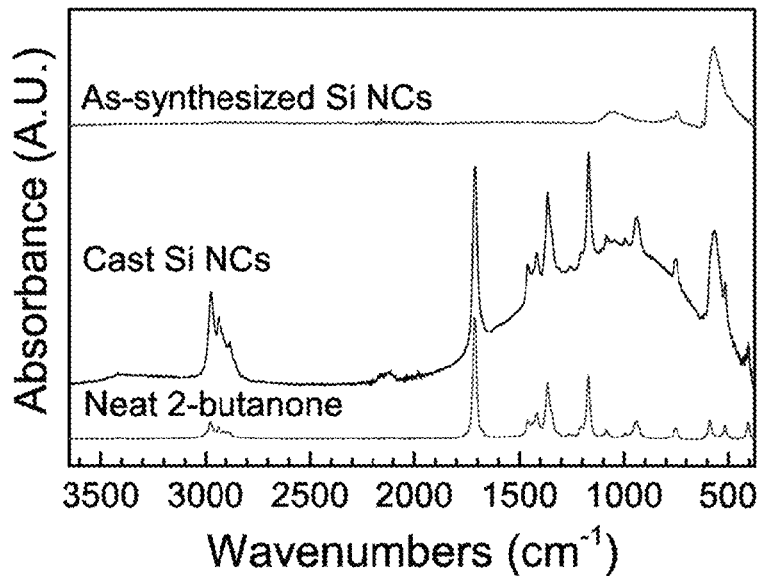
FIG. 32 illustrates free carrier absorption exhibited by Si nanocrystals cast from 2-butanone.

UV-Vis absorption spectroscopy of centrifuged Si nanocrystal solutions was performed on a Cary 5E UV-Vis spectrophotometer. Centrifugation was done at 4000 rpm for up to 30 minutes. After centrifugation, optically transparent solutions indicated insignificant scattering, and the Beer-Lambert law was employed to determine mass concentration from absorption by integrating the absorption spectra (FIGS. 30 and 32) from 550 nm to 800 nm. For highly-concentrated solutions, the detector saturated beyond 550 nm. The 2-butanone solution retained its initial concentration of 7 mg/ml, so it was used as the reference for the remaining solvents.

Samples were prepared by transferring Si nanocrystal solution to an evacuated quartz NMR tube and flame-sealing the tube. $^{13}$C NMR spectra were obtained on a Bruker Avance III 500 MHz spectrometer equipped with a BBFO Smart Probe by locking onto a D$_2$O capillary at ambient temperature. 1024 scans were obtained at 125 MHz with a 29761.9 Hz sweep width, 30 degree pulse width, 1.1 second acquisition time, and 2.0 second relaxation delay.

IR experiments were done on a diamond ATR crystal using a Bruker Alpha FTIR spectrometer inside an inert-atmosphere glove box. Spectra were typically collected by averaging 24 scans at 2 cm$^{-1}$ resolution.

Si nanocrystals were synthesized with a Cl-terminated surface via decomposition of $SiCl_4$ vapor in the presence of $H_2$ in a nonthermal plasma reactor. For control experiments, Si nanocrystals were also synthesized from silane to ensure the production of Si nanocrystals with a fully H-terminated surface (Anthony, *Advanced Functional Materials* 2011, 21:4042-4046). H-terminated Si nanocrystals were found to be insoluble in most solvents, but dilute solutions could be obtained by prolonged sonication, which is consistent with previous work (Erogbogbo, *ACS Nano* 2011, 5:7950-7959).

Cl-terminated Si nanocrystals were impacted downstream of the synthesis plasma and transferred to vial as a dense tower of Si nanocrystals (FIGS. 16a and b). The addition of an appropriate solvent, such as 2-butanone, and slight agitation by simply shaking the vial dispersed Si nanocrystals until a maximum concentration was reached, yielding an optically transparent solution (FIG. 16d). FIG. 18 depicts the Fourier transform infrared (FTIR) spectra contrasting the Si nanocrystal surface chemistry resulting from each silicon precursor ($SiH_4$ vs. $SiCl_4$) as well as a photograph of the resulting dispersions in 2-butanone. Si nanocrystals synthesized from $SiCl_4$ clearly showed that the $Si-Cl_x$ stretching mode is the dominant feature of the IR spectrum. As expected for a stable solution (Murray, *Science* 1995, 270:1335-1338), the Si nanocrystals self-assembled into device-quality films (FIGS. 9-13).

Figure 1H:
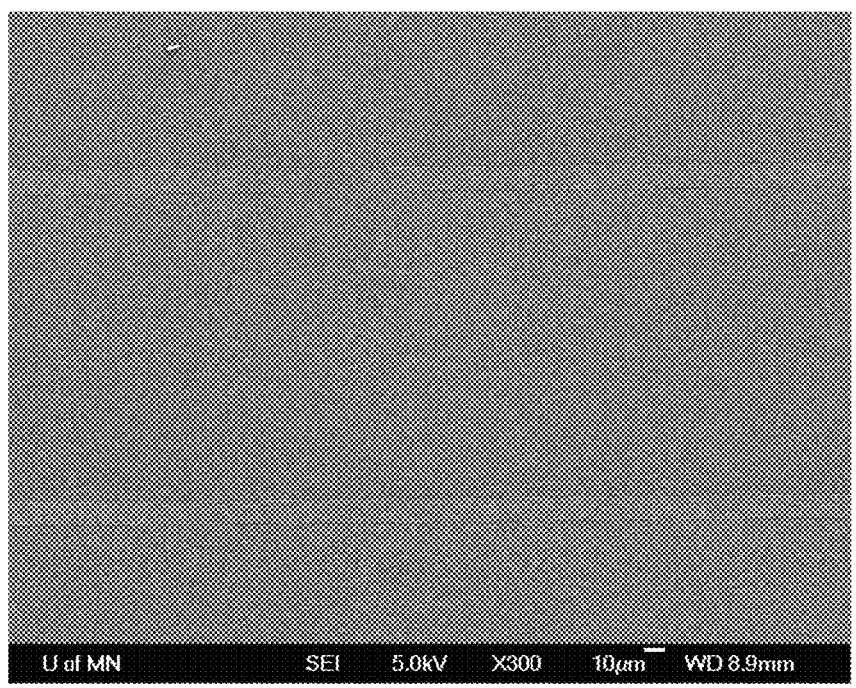
Figure 1I:
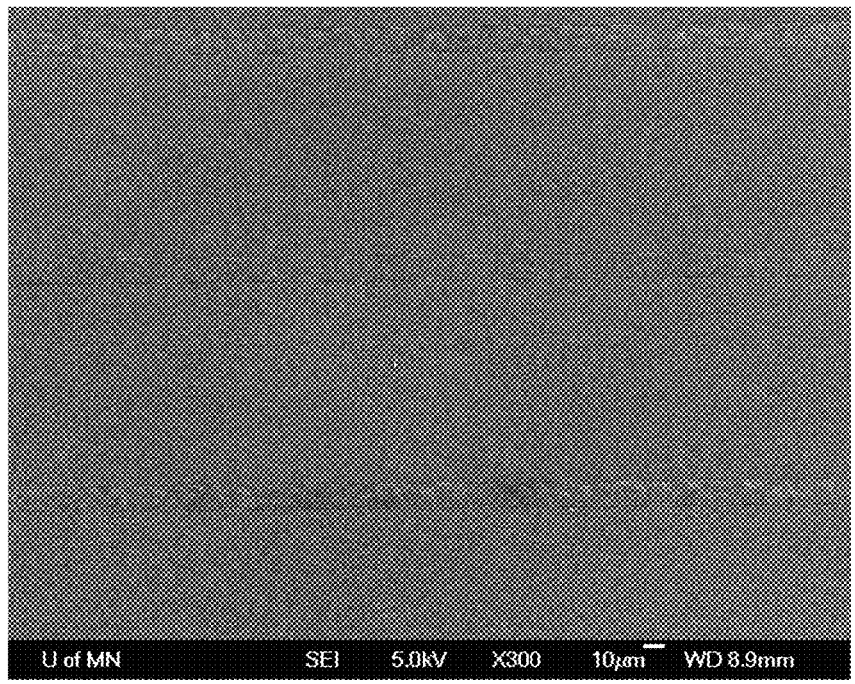
Figure 1J:
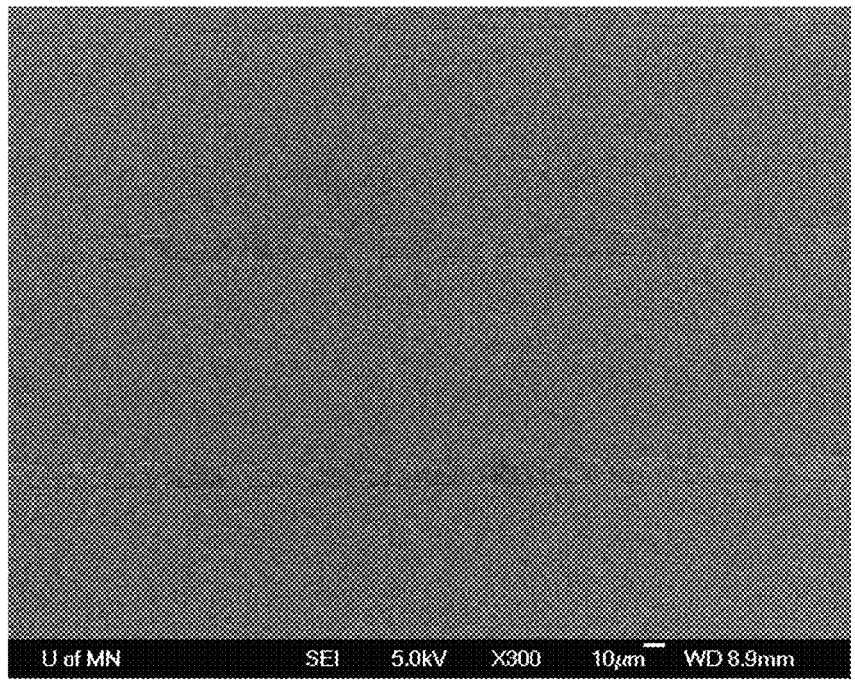
Figure 1K:
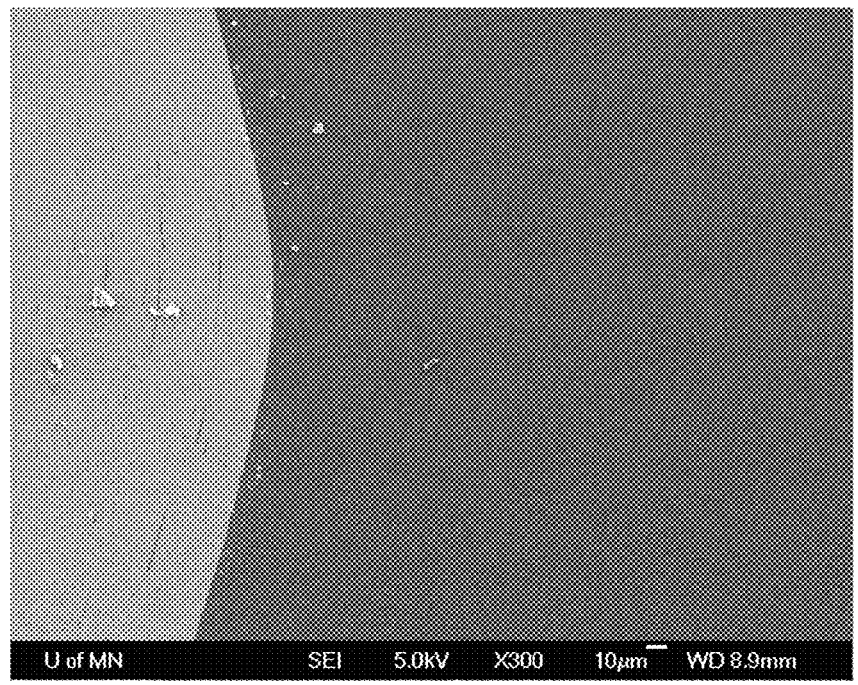
Figure 1L:
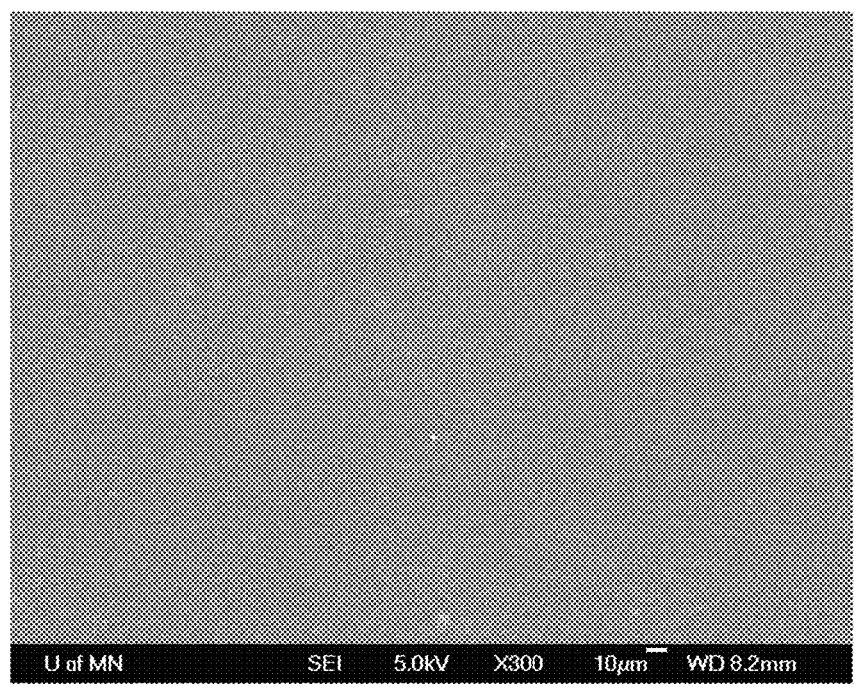
Figure 2:
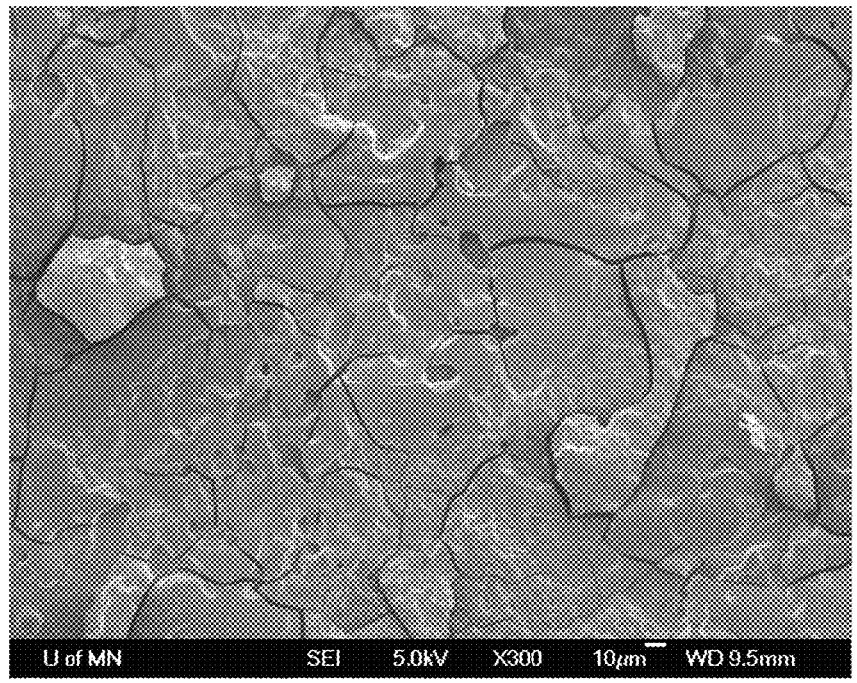
FIGS. 2-8 are SEMs of a film of silicon nanocrystals with long-chain organic ligands that exhibits many observable cracks.
Figure 3:
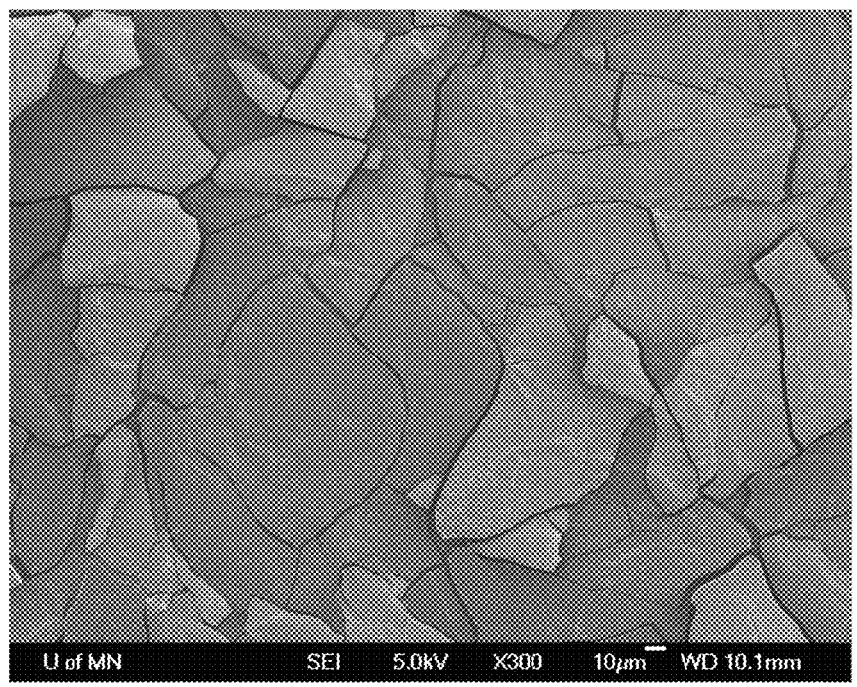
Figure 4:
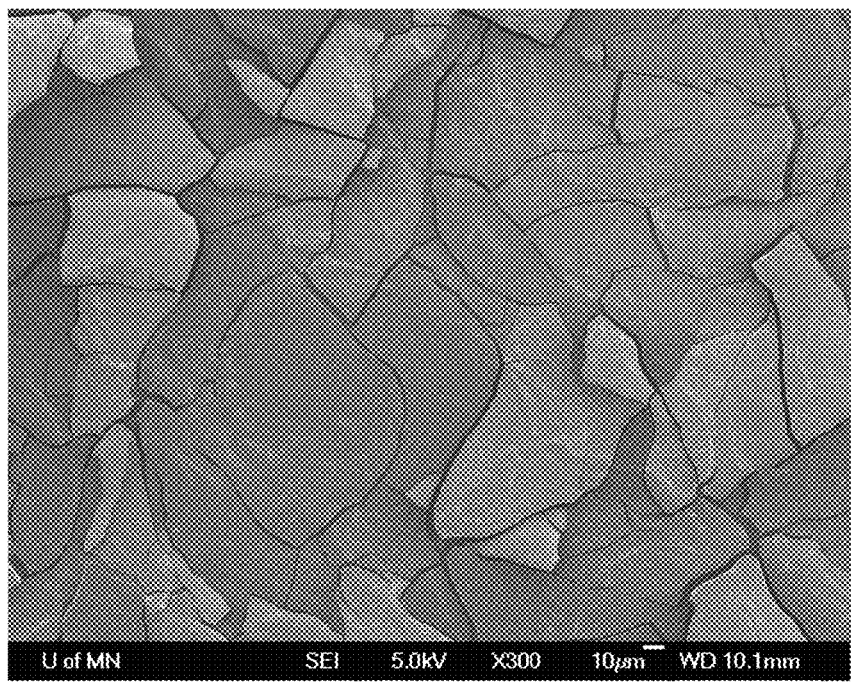
Figure 5:
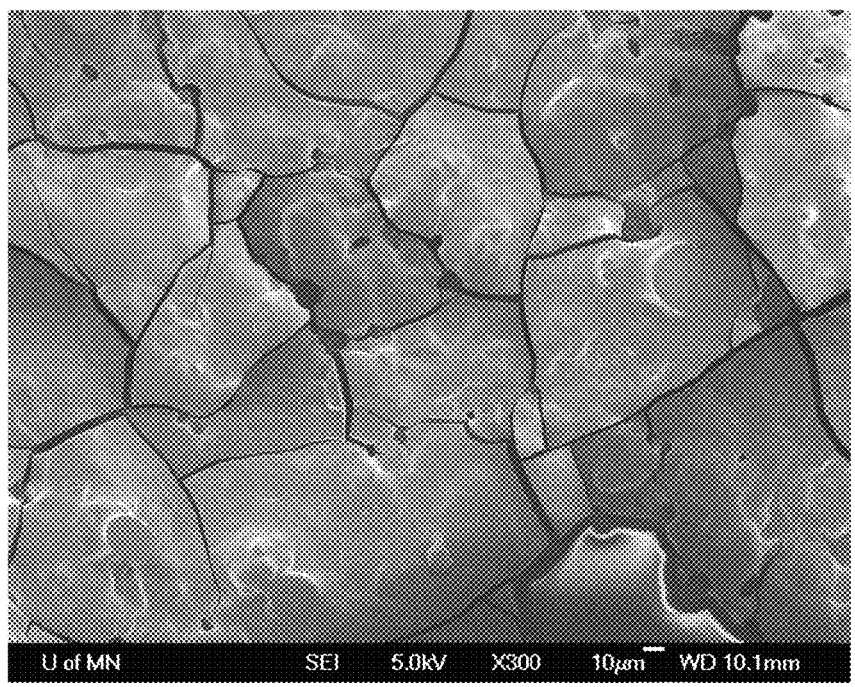
Figure 6:
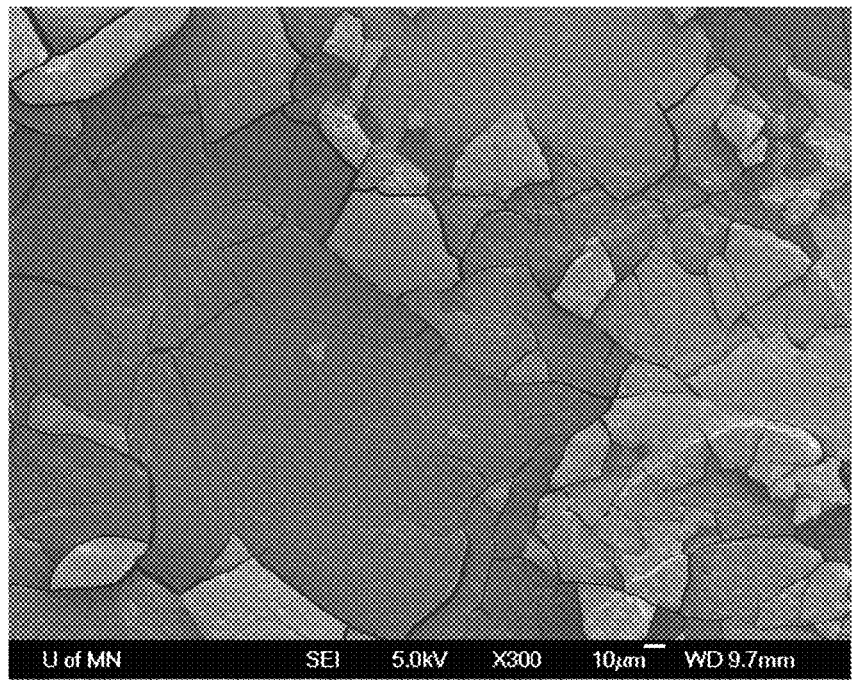
Figure 7:
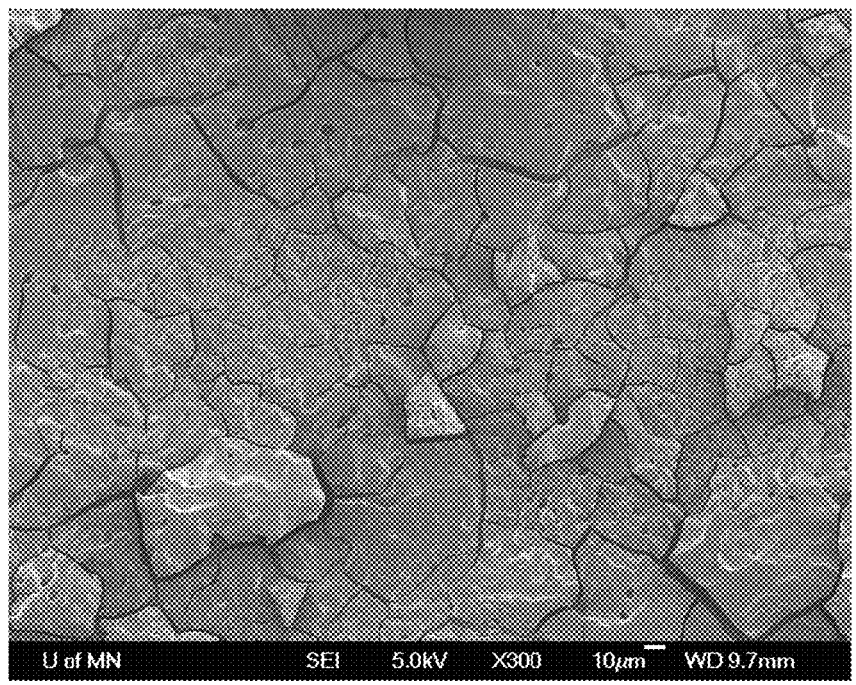
Figure 8:
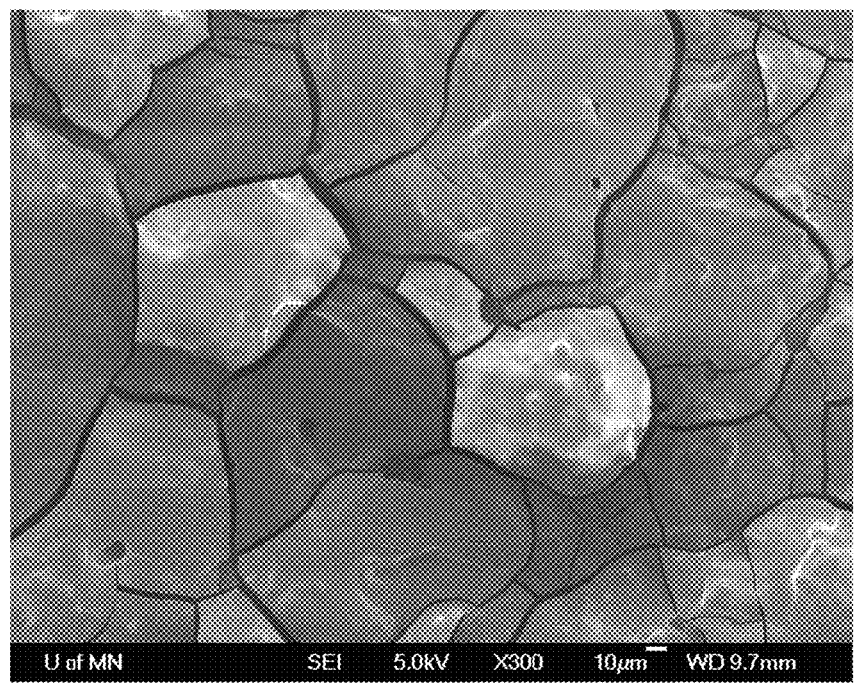
Figure 19:
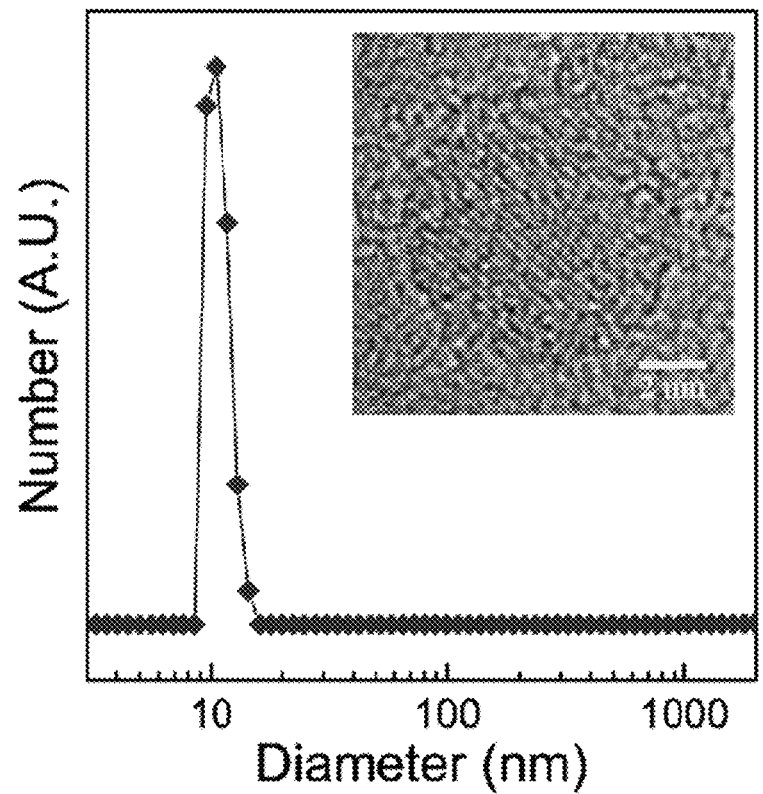
FIG. 19 illustrates a Dynamic Light Scattering (DLS) spectrum showing single-particle population of Si nanocrystals in 2-butanone with a diameter of 10 nm, which indicates a solvation shell of 2 nm when compared to TEM (inset).
Figure 20:
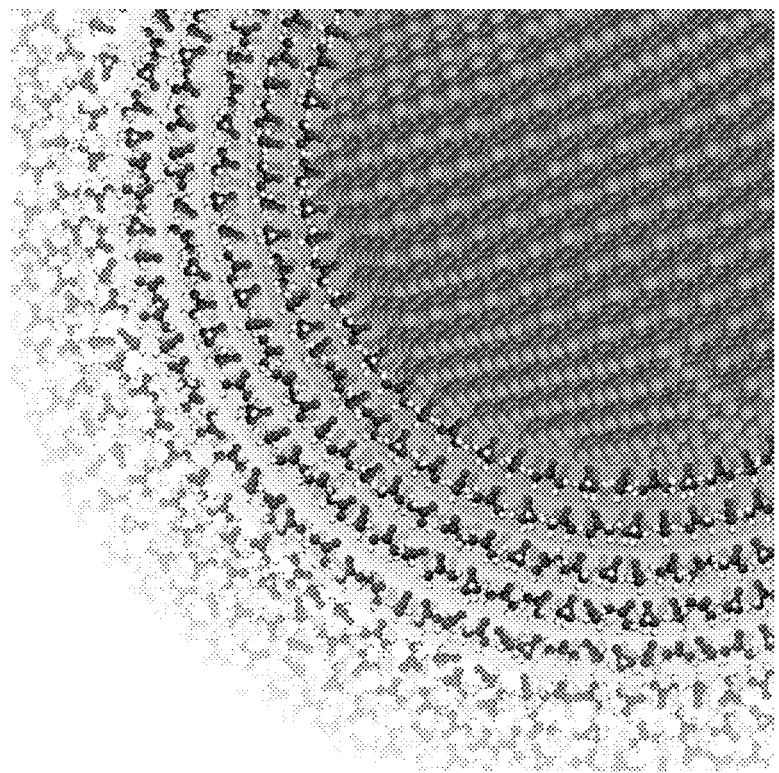
FIG. 20 is an illustration depicting how solvent molecules may assemble into solvation layers around the nanocrystal.
Figure 21:
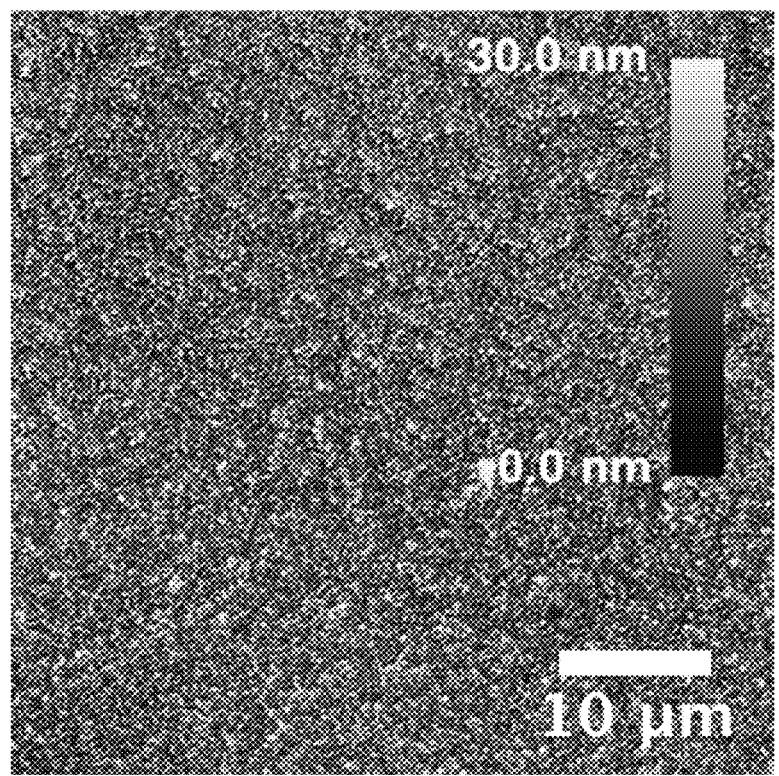
FIG. 21 illustrates a scanning probe microscopy micrograph of a film that is continuous over a large area with a root mean square roughness of 8.4 nm.

Dynamic Light Scattering (DLS) on the Cl-terminated Si nanocrystals solvated in 2-butanone, shown in FIG. 19, confirmed that the Si nanocrystals were not agglomerated, showing a single-particle population at 10 nm in diameter. FIG. 1h is a TEM image of a Si nanocrystal from that solution that is 8 nm in diameter. This observation is consistent with the well-known solvodynamic diameter measured by DLS, which includes the solvation layers that surrounds each nanocrystal (FIG. 20). We observed colloidal stability, and the formation of solvation layers, for a range of solvents that possess the following characteristics: (1) polar, (2) hard Lewis base sites, and (3) non-reactive. Table 1 provides illustrative examples.

TABLE 1

Solvent Characteristics for Colloidal Stability

| Name | Structure | Polar | Hard Lewis Base Site | Non-reactive | Stability |
|---|---|---|---|---|---|
| Ketones | $R_1^*-C(=O)-R_2$ | X | X | X | X |
| 1-Methyl-2-pyrrolidinone | N-methylpyrrolidinone structure | X | X | X | X |
| 2.3-Butanedione | $H_3C-C(=O)-C(=O)-CH_3$ | | X | X | |
| 2-Chloroalkanes | $R-CHCl-CH_3$ | X | | X | |
| Alcohols | $R-OH$ | X | X | | |
| Nitriles | $R^*-C\equiv N:$ | X | X | X | X |
| 1-Chloroalkanes | $R-(CH_2)_2-Cl$ | X | | X | |
| Phosphines | $R_1-P(R_2)-R_3$ | | | X | |
| Amines | $R_1-N(R_2)-R_3$ | X | X | | |
| Ketone (a) + Ketone (b) | $R_1^*-C(=O)-R_2$ + $R_3^*-C(=O)-R_4$ | X | X | X | X |

TABLE 1-continued

Solvent Characteristics for Colloidal Stability

| Name | Structure | Polar | Hard Lewis Base Site | Non-reactive | Stability |
|---|---|---|---|---|---|
| Ketone + n-Hexane | R₁*—C(=O)—R₂ + hexane | | X | X | |

Figure 22:
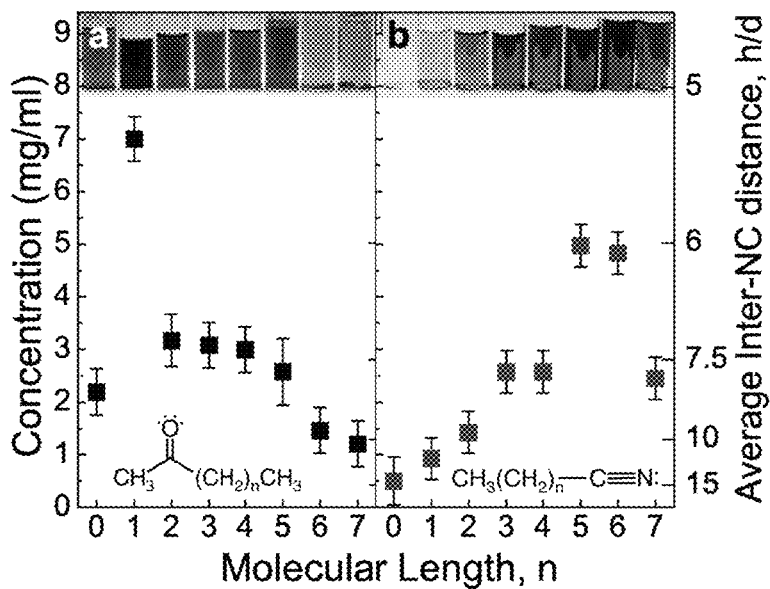
FIG. 22 is a graphical representation of Si nanocrystal maximum concentration as a function of molecular length, n, for n-alkanones (a) and n-alkanenitriles (b) as determined by UV-Vis absorption. The right axis is the average inter-NC separation distance. If electrostatics is the dominant mechanism of colloidal stability, then shorter molecules should achieve higher maximum concentrations. If steric effects were dominant, longer molecules are expected to provide more highly-concentrated Si nanocrystal solutions. Photographs of the solutions are included at the top of the graph. Error bars reflect uncertainty in mass measurements.

In a series of experiments, the importance of the two common mechanisms of colloidal stability were discounted: Steric and electrostatic barriers (Hiemenz, *Principles of Colloid and Surface Chemistry*, revised and expanded, volume 14. CRC, 1997). This was achieved by investigating the effects of varying the molecular length of the solvent. N-alkanones and n-alkanenitriles of varying lengths were chosen. FIGS. 22a and b show maximum concentration as a function of molecular length for the ketones and nitriles, respectively.

Ketone and nitrile solvent molecules can interact via non-covalent interactions with the Si nanocrystal surface. In an analogy to trioctylphosphine (TOP)- or trioctylphosphine oxide (TOPO)-stabilized metal chalcogenide nanocrystals, if the Si nanocrystal colloids are stabilized by steric interactions between the long-chain tails of the heteroatom-bound ligands, then longer chain molecules are expected to have a larger steric barrier and provide better stability. However, the data showed that the Si nanocrystal maximum concentration decreases with increasing ketone length (FIG. 22a). Nitriles exhibited a slightly different trend, with Si nanocrystal maximum concentration increasing with chain length until heptane- and octanenitrile (n=5 and 6, respectively), then decreasing again as chain length is increased further (FIG. 22b). If Si nanocrystal colloids are formed from steric interactions between the non-covalently bound solvent molecule, no decrease in stability should be observed upon increasing chain length. Furthermore, adding a typical non-polar solvent used in sterically-stabilized solutions, such as hexanes, causes Si nanocrystals to quickly flocculate and phase-separate from the stable solution, which suggests that non-polar solvents disrupt the stabilizing forces provided by the weakly-bound ketones or nitriles.

Figure 23:
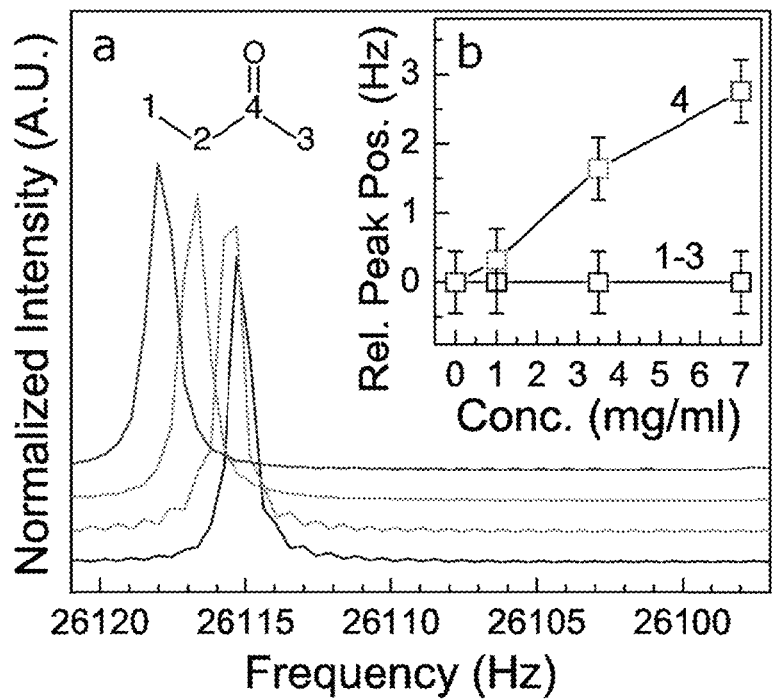
FIG. 23 illustrates (a) the carbonyl region of the 13C NMR spectra of Si nanocrystals stabilized in 2-butanone at concentrations of 0, 1, 3.5, and 7 mg/ml. The spectra are normalized and vertically offset for clarity. The downfield shift of the carbonyl peak is due to Si nanocrystal surface interactions and resulting interactions in the solvent shells surrounding the nanocrystal; and (b) the peak position relative to the neat solvent as a function of Si nanocrystal concentration in 2-butanone. The error bars correspond to the digital resolution of the spectrometer.

The interaction of solvent molecules with the Si nanocrystals was explored using $^{13}$C NMR. Since NMR is a time-averaged technique, solvent dynamics can be probed. Shifts are expected for short-lived interactions (shorter than the NMR signal decay time), whereas a strongly-bound molecule would give rise to a second peak. FIG. 23 shows the carbonyl region of the $^{13}$C NMR spectrum at increasing concentrations of Si nanocrystals in 2-butanone. The data showed a clear downfield shift of the carbonyl peak with increasing concentration from 0 to 7 mg/ml (FIGS. 23a and b), which illustrates the fluxional nature of the solvent molecules with the Si nanocrystal surface. Peaks corresponding to the aliphatic carbons did not shift (FIG. 23b). This effect is frequently observed in the solvation of ions as well as molecules when dissolved in carbonyl-containing solvents (Matsubara, *Journal of the Chemical Society, Faraday Transactions* 1998, 94:3601-3605). A downfield shift of the carbonyl carbon can establish direct interaction between the solute and the carbonyl oxygen, as well as intermolecular ordering of dipole moments in the solvation shells surrounding the solute. Although the 2-butanone molecules interact with the Si nanocrystal surface, they do not appear to be bound.

For electrostatic stabilization, which is typically described by Derjaguin, Landau, Verwey and Overbeek (DLVO) theory, a high dielectric constant (shorter ketone or nitrile) will more effectively screen charge. Indeed, high dielectric constant solvents such as water ($\in$=80.1) and formamide ($\in$=111.0) were needed to stabilize nanocrystals after terminating the surface with negatively-charged inorganic ligands (Nag, *Journal of the American Chemical Society* 2011, 133:10612-10620). If Si nanocrystal solubility was dominated by electrostatics, then shorter molecules with a higher dielectric constant should yield more highly concentrated solutions. However, Si nanocrystal maximum concentrations were highest for ketones (2-butanone, n=1) and nitriles (heptanenitrile, n=5) having only modest dielectric constants (18.6 and 15.6, respectively).

Additional evidence also supports electrostatics as being insignificant. First, the addition of electrolytes to stable solutions should contract any electrical double layer predicted by DLVO theory, which would allow the nanocrystals to agglomerate and fall out of solution. However, no such effect was observed upon adding 1.0 mg of NaCl to 1.0 mL solution of 0.5 mg/mL Si nanocrystals in 2-butanone (for a NaCl electrolyte concentration of 17 mM). Second, Si nanocrystals solvated in ketones show no measurable zeta-potential, which is the standard technique to evaluate colloidal charging (Pons, *The Journal of Physical Chemistry B* 2006, 110:20308-20316). Although some nitriles had zeta-potentials as high as −25 mV (benzonitrile), this is still below the widely-regarded 130 mV needed for colloidal stability based on electrostatic interactions, much less the −60 mV observed in the negatively-charged MMC-terminated nanocrystals (Kovalenko, *Science* 2009, 324:1417-1420). Moreover, the average inter-nanocrystal separations in our solutions (FIGS. 24a and b) are beyond the regime of continuum theory; thus non-DLVO forces, such as solvation, would be expected to dominate (Liang, *Advances in Colloid and Interface Science* 2007, 134:151-166; and Israelachvili. Intermolecular and Surface Forces. Academic press, 2011). Note that the Si nanocrystal dispersions remained stable for over one year when kept air free. Solutions in 2-butanone reached a h/d value of nearly 5, and Brownian motion alone would lead to flocculation on the time scale of a few microseconds without a significant barrier to agglomeration.

These data suggests that the dominant interactions within these Si nanocrystal solutions is distinct from either the electrostatic or steric mechanisms that provide colloidal stability for metal chalcogenide nanocrystal solutions. In contrast to these mechanisms, nanocrystal solubility based on dipole-dipole (Keesom) interactions appears to dominate in Cl-terminated Si nanocrystal solutions. To test this hypothesis, we compared the solubility of Cl-terminated Si nanocrystals in 2,3-butanedione to 2-butanone (Table 1). Whereas both molecules contain a hard, Lewis basic site and are non-reactive with the surface Si—Cl bonds, the polar 2-butanone can stabilize Si nanocrystals, while the non-polar 2,3-butanedione does not solubilize Si nanocrystals. Similar experiments with a variety of polar/non-polar, hard/soft Lewis base, and reactive/non-reactive solvents were performed and are summarized in Table 1. Based on these data, all three of these key criteria (polar, hard Lewis base sites, and non-reactive) should be satisfied for the dipole-dipole mechanism to provide colloidal stability of nanocrystals with Lewis acidic surfaces.

The interaction of the Si nanocrystal surface with the surrounding solvent was further investigated using attenuated total reflectance Fourier transform infrared (ATR-FTIR) spectroscopy. IR vibrational modes are well known to be sensitive to a variety of non-covalent interactions. Due to their spectral isolation, the carbonyl (Nyquist, *Applied Spectroscopy* 1990, 44:433-438) and nitrile (Fawcett, *The Journal of Physical Chemistry* 1993, 97:9293-9298) groups have been extensively studied in this regard. In the dipole-dipole model, the carbonyl and nitrile groups are Lewis bases that interact with the Lewis acidic Si—Cl surface sites on the Si nanocrystals. IR studies of a molecular analog to the Si nanocrystal surface, $HSiCl_3$, have demonstrated neutral hypervalent complex (Lewis acid-base adduct) formation with oxygen and nitrogen donor atoms (Jeng, *Inorganic Chemistry* 1990, 29:837-842).

Figure 24:
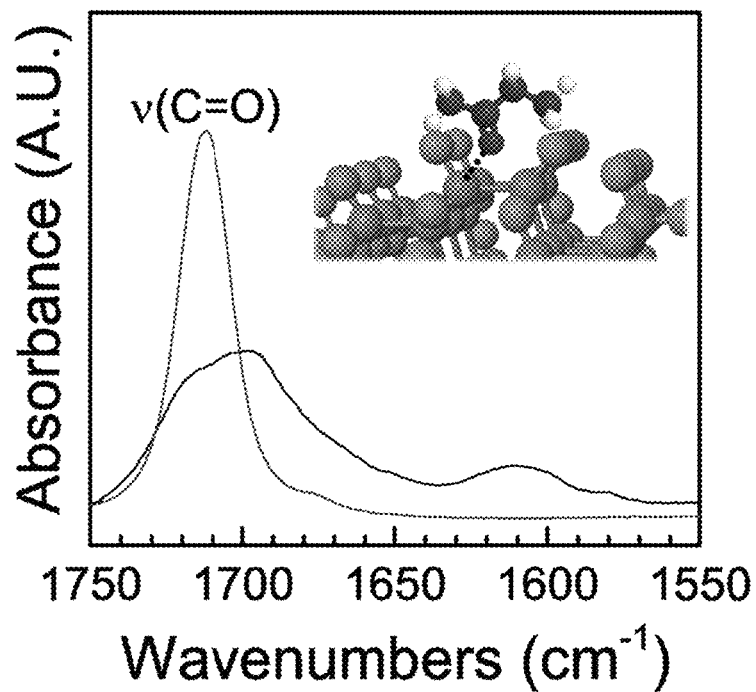
FIG. 24 illustrates an FTIR spectra of the carbonyl stretch region for neat 2-butanone (tall sharp peak at about 1720 $cm^{-1}$) and Si nanocrystals cast from 2-butanone (shorter, broader spectrum), which yield evidence for non-covalent interactions at the Si nanocrystal surface as depicted in the inset.

IR spectral evidence of a solvent-Si nanocrystal surface interaction is apparent in the carbonyl region in films of Cl-terminated Si nanocrystals that were cast from a 2-butanone solution onto the ATR crystal (FIG. 24). In the presence of Si nanocrystals, the carbonyl peak broadened and red-shifted by 25 $cm^{-1}$. Such shifts can be attributed to dipole-dipole interactions and are often observed in ketones in the presence of solute molecules (Nyquist, *Applied Spectroscopy* 1990, 44:433-438) or ions (Deng, *Journal of the Chemical Society, Faraday Transactions* 1992, 88:2891-2896). Additionally, a lower-energy satellite peak emerged at 1610 $cm^{-1}$ that is consistent with more strongly bound 2-butanone molecules that form a hypervalent complex to a surface Si atom. As with any Lewis acid-base adduct, electron density is donated from the donor species (oxygen) to the acceptor (Si surface atom) species. The carbonyl bond is thus weakened and vibrates at a lower frequency of 1610 $cm^{-1}$ relative to the unbound ketone. These strongly-bound molecules make up the first solvation shell, with additional solvation shells ordering their dipole moments with that of the first solvation shell, as depicted in FIG. 20.

Figure 25:
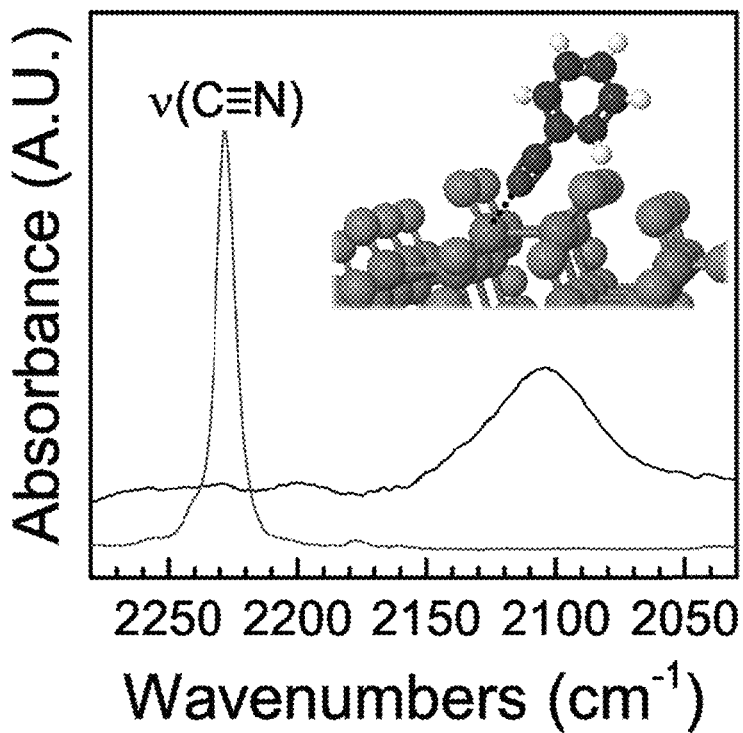
FIG. 25 illustrates an FTIR spectra of the nitrile stretch region for neat benzonitrile (tall sharp peak at about 2225 $cm^-$) and Si nanocrystals cast from benzonitrile (shorter, broader spectrum), which yield evidence for non-covalent interactions at the Si nanocrystal surface as depicted in the inset.

The IR spectra in FIG. 25 show a similar effect in the nitrile stretching region for a Si nanocrystal solution in benzonitrile. When solvents contain a nitrile group, Si nanocrystal can be synthesized with deuterium instead of hydrogen to avoid overlapping Si—$H_x$ stretching with the nitrile stretching region of the IR spectrum. As with 2-butanone, the nitrile band was also broadened, but was entirely red-shifted from 2225 $cm^{-1}$ to 2110 $cm^{-1}$. The red-shift was of similar magnitude to that observed in 2-butanone and was also attributed to hypervalent complex formation at the Si nanocrystal surface. In this case, however, the relatively bulky benzonitrile apparently prevented strong dipole-dipole interactions between the solvation shells. Solvent shells are able to evaporate, and only the first solvation shell (i.e. the benzonitrile molecules strongly bound to the Si nanocrystal surface) are left behind. Thus, all CN stretches in the FTIR spectrum are from the strongly bound solvent molecules.

Figure 26:
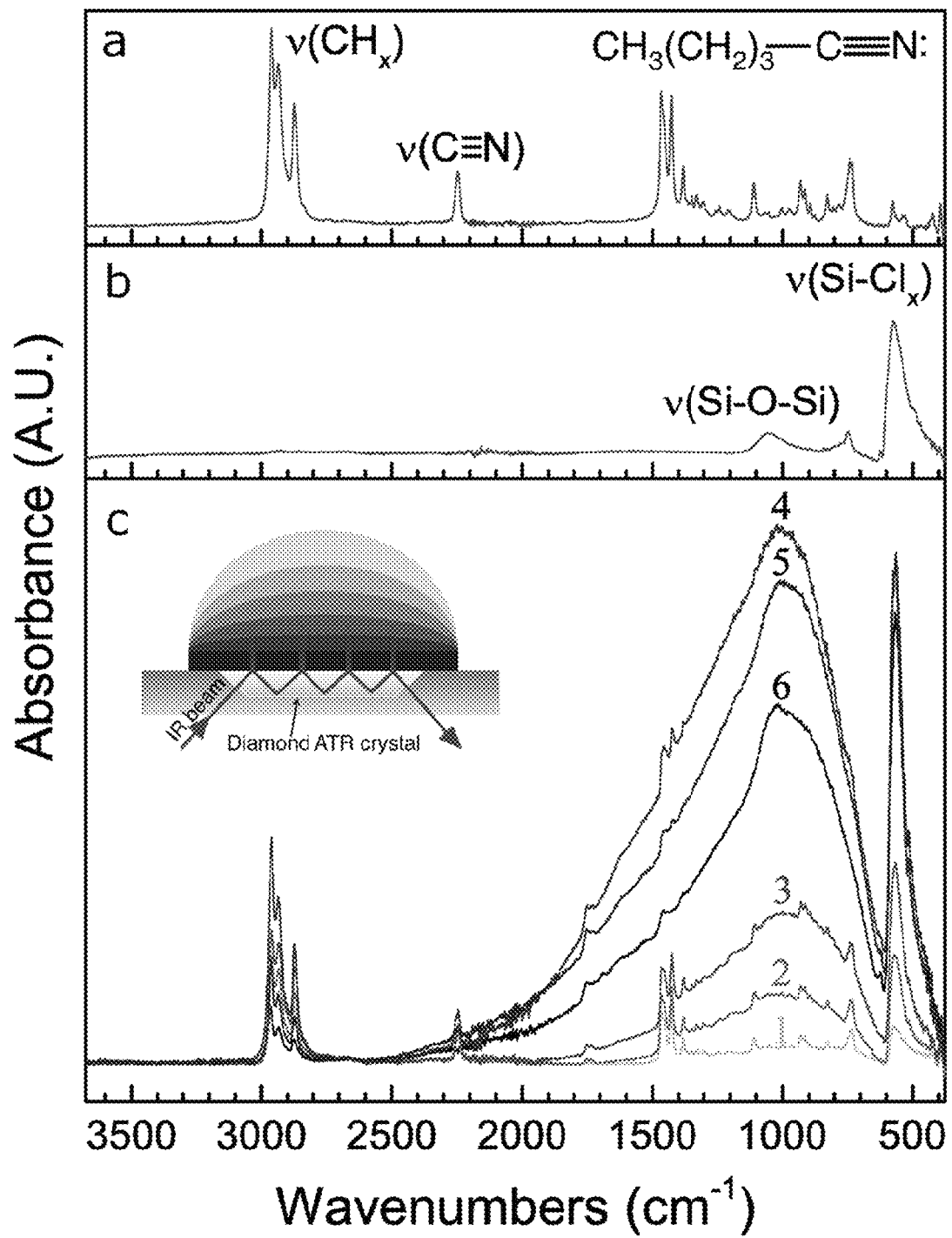
FIG. 26 illustrates (a) IR spectra of as-synthesized Si nanocrystals; (b) IR spectra of neat pentanenitrile; (c) a solution of Si nanocrystals solvated in pentanenitrile is dropped onto the ATR crystal, and spectra are recorded every 20 seconds. Spectra are not normalized. The spectra are identical to neat pentanenitrile until a broad absorption due to free carrier absorption is observed. The absorption arises from solvent molecules non-covalently bound to the nanocrystal surface that effectively dope the nanocrystal. As solvent evaporates, the broad IR absorption band increases in intensity from (1) to (4) then decreases and red-shifts as solvent evaporates from the Si nanocrystal surface, and a film is assembled at (6).
Figure 27:
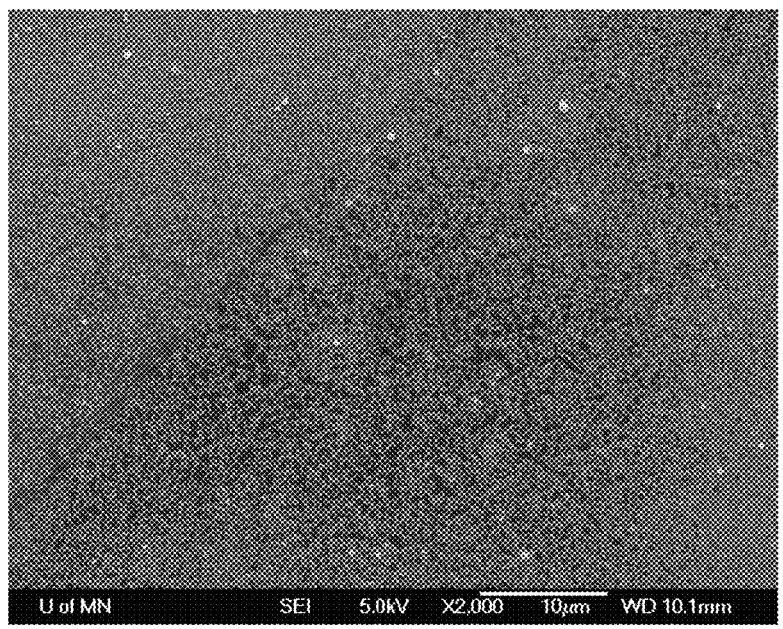
FIGS. 27-29 illustrate SEM images of a film of H-terminated Si nanocrystal (casted on Al electrodes) deposited on glass from a dicholorobenzene suspension. Films are clearly discontinuous (FIG. 27) and agglomerated (FIG. 28). The film in FIG. 29 is intentionally scraped away in the upper left portion of the image.
Figure 33:
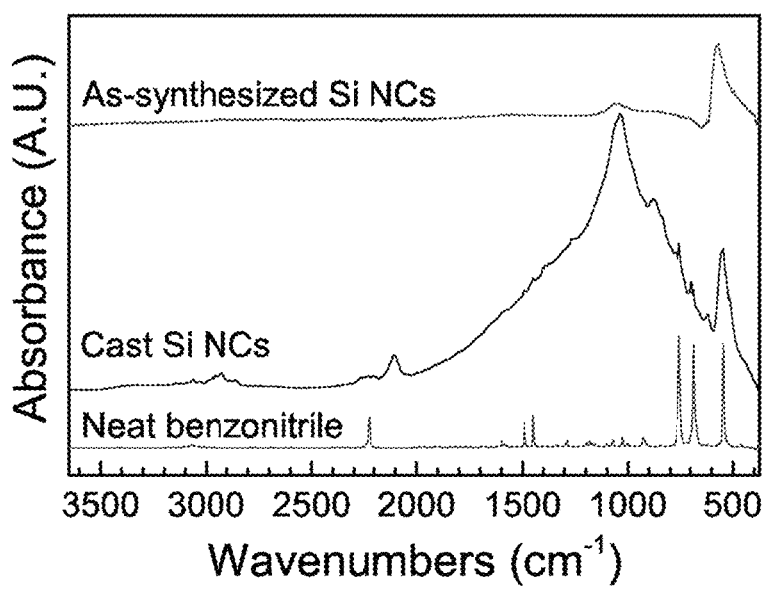
FIG. 33 illustrates free carrier absorption exhibited by Si nanocrystals cast from benzonitrile.

Beyond the carbonyl or nitrile regions of the spectrum, the most prominent feature was a broad absorption that spanned from 500 $cm^{-1}$ to 2500 $cm^{-1}$. This is shown in FIG. 26c for a solution of Si nanocrystals in pentanenitrile. This broad IR feature was observed for all stabilizing solvents (FIGS. 32 and 33) and was not present in control experiments. A similar phenomenon has been observed in porous Si upon surface-adsorption of acceptor or donor molecules in a vacuum chamber (Timoshenko, *Physical Review B* 2001, 64:085314; and Garrone, *Advanced Materials* 2005, 17:528-531). The broad IR absorption was attributed to free carrier absorption. Adsorbed molecules inject a donor or acceptor-like surface state, which effectively "dopes" the porous Si. The molecules do not form covalent bonds, and the broad absorption is reversible when molecules are removed under vacuum, which suggests that the original surface chemistry was undisturbed.

Figure 28:
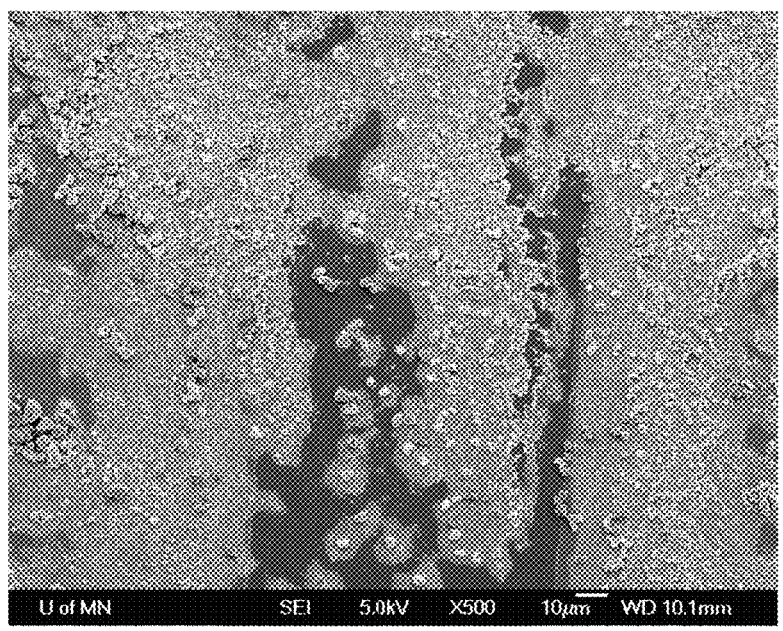
Figure 29:
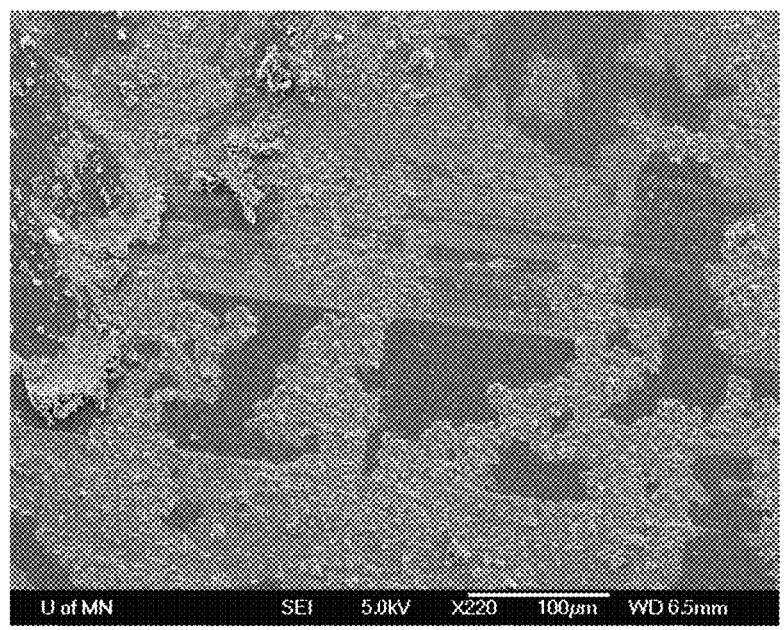

The observations in porous Si are in agreement with our data and provided further evidence that hard donor groups from the solvents interact strongly but reversibly with the Si nanocrystal surfaces to provide colloidal stability. An IR spectrum was taken every 20 seconds as a drop of the Si nanocrystal solution in pentanenitrile evaporated and assembled into a film in FIG. 28c. The initial spectrum was nearly identical to the neat pentanenitrile. The broad absorption then emerged with the Si—Cl stretching vibration of the Si nanocrystals. The IR absorption intensity increased from (1) to (4) where it reached a maximum after 640 seconds of evaporating time. It then slowly decreased and red-shifted as solvent molecules evaporated from the Si nanocrystal surface, and a film was assembled at (6). This result suggests that some of the surface-bound molecules were removed via evaporation after (4), and the final film contained nanocrystals that were incompletely covered with adsorbed solvent species. This doping effect is consistent with the hypervalent interaction of the acidic surface Si atoms with donor groups of the solvent.

Example 4

Figure 34:
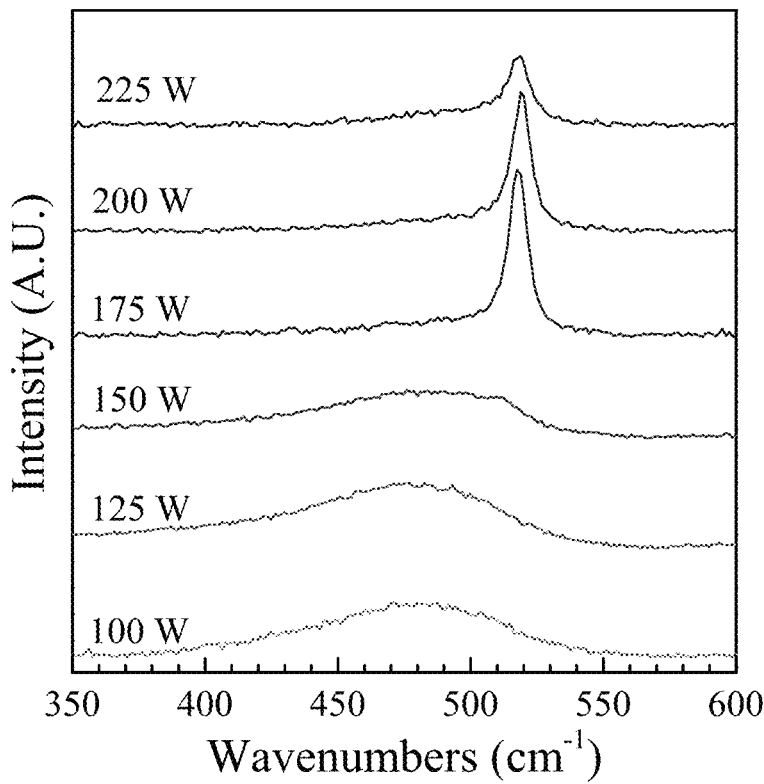
FIG. 34 illustrates a crystalline peak in the Raman spectrum of exemplary Si nanocrystals.
Figure 35:
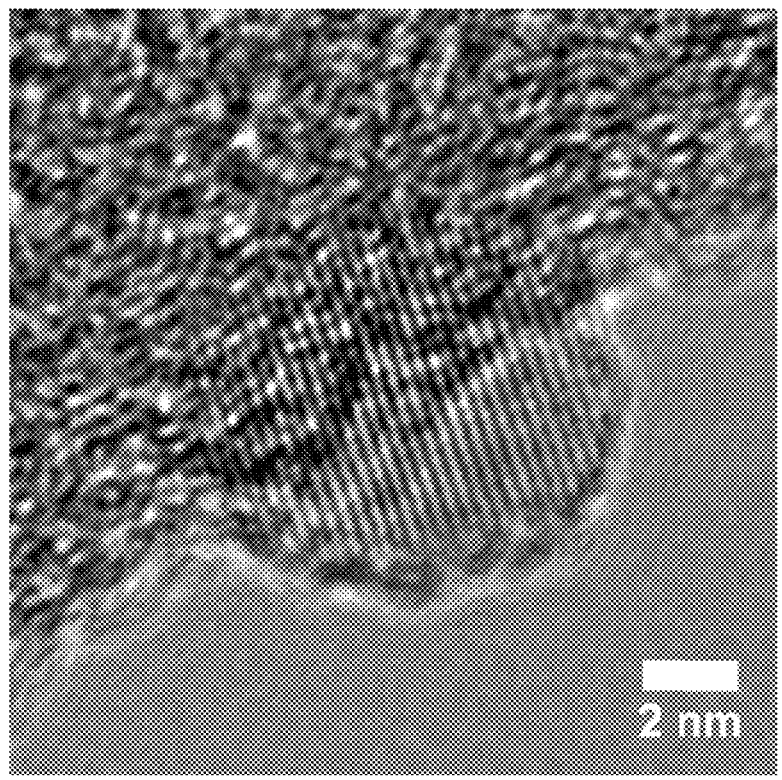
FIG. 35 illustrates a transmission electron micrograph of exemplary Si nanocrystals.

Cl-terminated Si nanocrystals were synthesized by flowing 30 sccm of argon, 20 sccm of $H_2$, and 4 sccm $SiCl_4$ into an evacuated plasma reactor depicted in FIG. 16a (Mangolini, *Nano Letters* 2005, 5:655-659) and applying a nominal RF power of 60 W at 13.56 Hz to a pair of ring electrodes mounted on an alumina tube (1.90 cm OD, 1.27 ID). The pressure in the reactor was 733 Pa. Si nanocrystals showed a crystalline peak in the Raman spectrum (FIG. 34) and were approximately 8 nm from Scherrer broadening of the XRD peak fitting and TEM (FIG. 35).

Because the chlorinated Si nanocrystal surface is quite reactive to ambient conditions, all processing was done air-free. Si nanocrystals were collected by impacting them onto a substrate downstream of the plasma. The Si nanocrystals were transferred from the reactor in a vacuum-component assembly pressurized with argon and further processed on a Schienk line or in an inert-atmosphere glove box. For UV-Vis absorption, Si nanocrystals were transferred into an ampule and capped with a septum in the glove box. The capped ampule was removed from the glove box and a solution was formed by transferring solvent to the ampule via cannula. The nitrogen atmosphere was removed, the ampule was flame-sealed, and the solution was centrifuged to remove any agglomerated nanocrystals.

Figure 36:
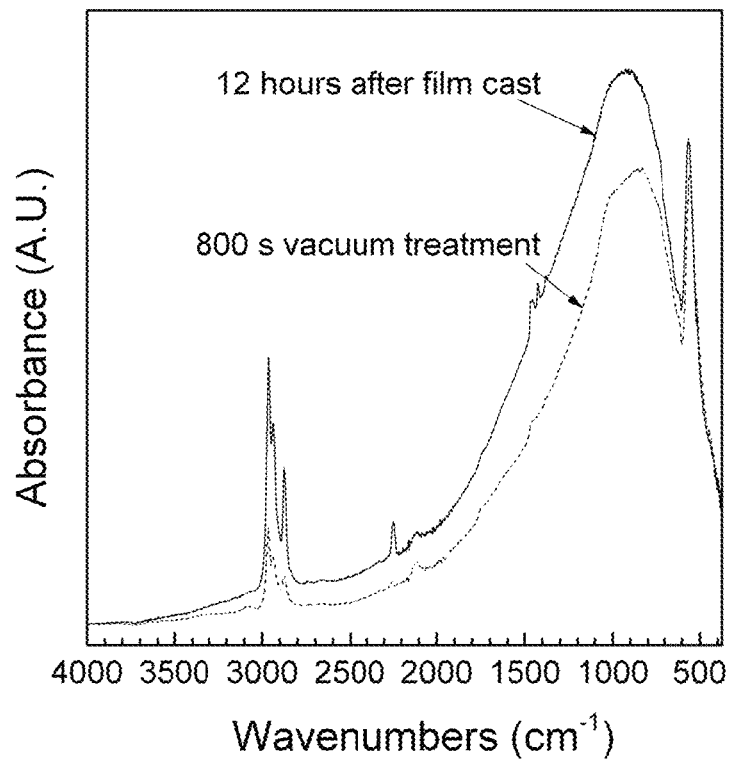
FIG. 36 illustrates the effect of pulling vacuum on a film of exemplary Si nanocrystals to remove residual solvent as observed by FTIR.
Figure 37:
FIG. 37 illustrates an SEM cross-section of an exemplary device prepared from a Si nanocrystal film.

Thin films of Si nanocrystals were assembled by spin-casting Si nanocrystals stabilized in benzontrile. Si nanocrystals were drop-cast onto a substrate with pre-deposited 40 nm-think aluminum electrodes and spun at 1500 rpm for 1 minute. This was repeated 6 times. The film was transferred to a vacuum annealing chamber. Pulling vacuum on the film removed residual solvent as observed by FTIR (FIG. 36). The film was annealed for 12 hours to achieve an ohmic contact with the Al electrode. A 100 nm top aluminum contact was evaporated on top of the Si nanocrystal film to complete the device. An SEM cross-section of the device is shown in FIG. 37.

Figure 38:
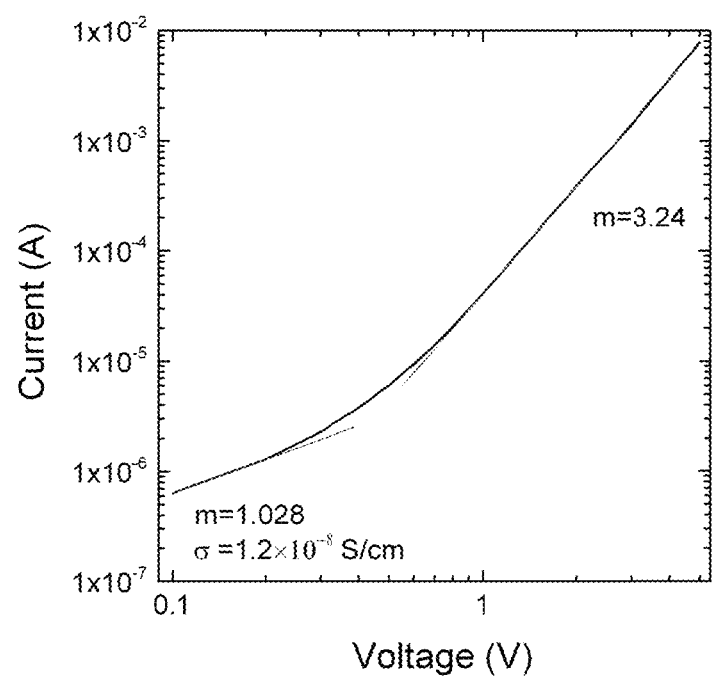
FIG. 38 illustrates a current-voltage curve from an exemplary device prepared from a Si nanocrystal film.

Current-voltage characterization of a Si nanocrystal device was carried out. A current-voltage curve is shown in FIG. 38. Two distinct regimes were identified. The region from 0 V to 0.1 V exhibited ohmic transport with a dark conductivity of $1.2 \times 10^{-8}$ S/cm (Vetterl, *Solar Energy Materials and Solar Cells* 2000, 62:97-108; Hazra, *Solid State Communications* 1998, 109:125-128; and Yu et al., in *Icsict*-95 (IEEE, 1995), pp. 66-68). Intrinsic amorphous Si films have dark conductivities of $10^{-10}$ S/cm. At best, intrinsic bulk micro-crystalline silicon has been shown to have dark conductivities as high as $10^{-6}$. In contrast to the solution-processed films presented here, these films were deposited by plasma-enhanced chemical vapor deposition, a high-vacuum process. It is also notable that white light illumination on the film consistently increased conductivity, demonstrating viability as a photoactive material for photovoltaics.

The complete disclosure of all patents, patent applications, and publications, and electronically available material cited herein are incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A silicon nanocrystal ink comprising partially halide-terminated nanocrystals of silicon or an alloy thereof in an organic solvent that is effective to form a colloidal dispersion of the silicon nanocrystals.

2. The silicon nanocrystal ink of claim 1 wherein the partially halide-terminated nanocrystals are halide- and hydrogen-terminated nanocrystals of silicon or an alloy thereof.

3. The silicon nanocrystal ink of claim 1 wherein the partially halide-terminated nanocrystals are partially chloride-terminated nanocrystals of silicon or an alloy thereof.

4. The silicon nanocrystal ink of claim 1 wherein the partially halide-terminated nanocrystals are chloride- and hydrogen-terminated nanocrystals of silicon or an alloy thereof.

5. The silicon nanocrystal ink of claim 1 wherein the ink comprises at least $1 \times 10^{-5}$ volume fraction of the partially halide-terminated nanocrystals of silicon or an alloy thereof.

6. The silicon nanocrystal ink of claim 1 wherein the organic solvent is a dipolar, organic solvent having a hard donor group, without a strongly acidic site, and does not chemically react with the nanocrystal surface.

7. The silicon nanocrystal ink of claim 1 wherein the solvent has a largest dimension of at most 1.5 nm.

8. The silicon nanocrystal ink of claim 1 wherein the organic solvent is selected from the group consisting of halogenated aromatics, ketones, esters, N-substituted pyrrolidinones, nitriles, and combinations thereof.

9. The silicon nanocrystal ink of claim 1 wherein the organic solvent is selected from the group consisting of 1,2-dichlorobenzene, methyl alkyl ketones, N-methylpyrrolidinone, benzonitrile, and combinations thereof.

10. A method of preparing a silicon nanocrystal ink according to claim 1 comprising combining partially halide-terminated nanocrystals of silicon or an alloy thereof with an organic solvent under conditions effective to form a colloidal dispersion of the silicon nanocrystals.

11. The method of claim 10 wherein conditions effective comprise gentle mixing or sonication at room temperature.

12. A method of making a silicon nanocrystal film comprising solution coating a silicon nanocrystal ink according to claim 1.

13. The method of claim 12 wherein solution coating comprises a method selected from the group consisting of drop casting, spin coating, dip coating, Mayer rod coating, doctor blade coating, inkjet printing, screen printing, contact printing, and combinations thereof.

14. The method of claim 12 further comprising allowing the organic solvent to evaporate at a temperature of at most 250° C.

15. The method of claim 12 further comprising heating the film to at most 350° C. to remove the halide.

16. A silicon nanocrystal ink comprising at least $1 \times 10^{-5}$ volume fraction of non-agglomerated nanocrystals of silicon or an alloy thereof in an organic solvent that is effective to form a colloidal dispersion of the nanocrystals, wherein the nanocrystals are free of organic ligands and surfactants.

17. A silicon nanocrystal film having an area of at least 9 $cm^2$ that exhibits no cracks observable by SEM, AFM, or optical microscopy, wherein the nanocrystals comprise silicon or an alloy thereof and are free of organic ligands and surfactants.

18. The silicon nanocrystal film of claim 17 wherein the film is cast on a wafer having a largest dimension of at least 4 inches.

19. The silicon nanocrystal film of claim 17 wherein the nanocrystals comprise silicon or an alloy thereof and are free of oxides.

20. A silicon nanocrystal film comprising partially halide-terminated nanocrystals of silicon or an alloy thereof.

21. The silicon nanocrystal film of claim 20 wherein the film has an area of at least 9 $cm^2$ and exhibits no cracks observable by SEM, AFM, or optical microscopy.

22. The silicon nanocrystal film of claim 20 wherein the film is cast on a wafer having a largest dimension of at least 4 inches.

23. The silicon nanocrystal film of claim 20 wherein the nanocrystals are free of oxides.

24. The silicon nanocrystal film of claim 20 wherein the nanocrystals are free of organic ligands and surfactants.

25. A semiconductor device comprising a silicon nanocrystal film according to claim 20.

26. The semiconductor device of claim 25 wherein the device is a solar cell, a transistor, a photodetector, or a light emitting diode.

27. A method of preparing an amine-terminated silicon nanocrystal film comprising:
    providing a silicon nanocrystal film according to claim 20; and
    contacting an amine with the nanocrystal film under conditions effective to replace at least a portion of the halides and form an amine-terminated nanocrystal film of silicon or an alloy thereof.

28. A method of preparing an alkyl-terminated silicon nanocrystal film comprising:
    providing a silicon nanocrystal film according to claim 20; and
    contacting an alkyl Grignard reagent with the nanocrystal film under conditions effective to replace at least a portion of the halides and form an alkyl-terminated nanocrystal film of silicon or an alloy thereof.

29. A method of preparing an oxygen-terminated silicon nanocrystal film comprising:
    providing a silicon nanocrystal film according to claim 20; and contacting an oxidizing agent with the nanocrystal film under conditions effective to replace at least a portion of the halides and form an oxygen-terminated nanocrystal film of silicon or an alloy thereof.

\* \* \* \* \*